US012326389B2

(12) United States Patent
Fouda et al.

(10) Patent No.: US 12,326,389 B2
(45) Date of Patent: Jun. 10, 2025

(54) COMBINED PROCESSING OF BOREHOLE IMAGERS AND DIELECTRIC TOOLS

(71) Applicant: Halliburton Energy Services, Inc., Houston, TX (US)

(72) Inventors: Ahmed Fouda, Houston, TX (US); Baris Guner, Houston, TX (US); Mahmoud Eid Hussein Selim, Dhahran (SA)

(73) Assignee: Halliburton Energy Services, Inc., Houston, TX (US)

( * ) Notice: Subject to any disclaimer, the term of this patent is extended or adjusted under 35 U.S.C. 154(b) by 431 days.

(21) Appl. No.: 17/483,354

(22) Filed: Sep. 23, 2021

(65) Prior Publication Data

US 2023/0092035 A1  Mar. 23, 2023

(51) Int. Cl.
*G01N 15/08* (2006.01)
*E21B 47/002* (2012.01)
(Continued)

(52) U.S. Cl.
CPC ......... *G01N 15/08* (2013.01); *E21B 47/0025* (2020.05); *G01N 15/0806* (2013.01);
(Continued)

(58) Field of Classification Search
CPC ............... G01N 15/08; G01N 15/0806; G01N 2015/0846; G01N 2015/0853;
(Continued)

(56) References Cited

U.S. PATENT DOCUMENTS 10,754,055 B2   8/2020 Yamada et al.
2005/0159895 A1   7/2005 Haugland
(Continued)

FOREIGN PATENT DOCUMENTS

WO   WO 2021154797   *  8/2021   ............... G01V 3/38

OTHER PUBLICATIONS

International Search Report and Written Opinion for Application No. PCT/US2021/052681, dated Jun. 16, 2022.
(Continued)

*Primary Examiner* — Alexander Satanovsky
(74) *Attorney, Agent, or Firm* — John Wustenberg; C. Tumey Law Group PLLC

(57) ABSTRACT

Systems and methods for obtaining a calibrated permittivity dispersion measurements of a subsurface formation by measuring an impedance of the subsurface formation using a borehole imager at a first one or more frequencies; measuring a permittivity of the subsurface formation using a reference tool at a second one or more frequencies; calculating a first dispersion curve of the permittivity of the subsurface formation based at least in part on the measured impedance of the subsurface formation at the first one or more frequencies; extrapolating the permittivity of the subsurface formation to the second one or more frequencies using the calculated first dispersion curve of the permittivity of the subsurface formation; calibrating the permittivity of the subsurface formation based at least in part on the extrapolated permittivity of the subsurface formation and the measured permittivity of the subsurface formation; and generating a second dispersion curve of the permittivity of the subsurface formation based at least in part on one or more of the calibrated permittivity of the subsurface formation at the first one or more frequencies and the measured permittivity of the subsurface formation at the second one or more frequencies.

12 Claims, 13 Drawing Sheets

(51) Int. Cl.
*G01R 27/26* (2006.01)
*G01V 3/18* (2006.01)

(52) U.S. Cl.
CPC ........... *G01R 27/2617* (2013.01); *G01V 3/18* (2013.01); *G01N 2015/0846* (2013.01); *G01N 2015/0853* (2013.01)

(58) Field of Classification Search
CPC .. E21B 47/0025; G01R 27/2617; G01V 3/18; G01V 3/24
See application file for complete search history.

(56) References Cited

U.S. PATENT DOCUMENTS

| | | | |
|---|---|---|---|
| 2018/0120470 A1* | 5/2018 | Yamada | E21B 47/0025 |
| 2018/0372906 A1 | 12/2018 | Hou et al. | |
| 2019/0094405 A1 | 3/2019 | Itskovich et al. | |
| 2021/0010367 A1* | 1/2021 | Seleznev | E21B 47/13 |
| 2021/0055449 A1 | 2/2021 | Guner et al. | |

OTHER PUBLICATIONS

Guner, Baris, et al. "Quantitative Demonstration of a High-Fidelity Oil-Based Mud Resistivity Imager Using a Controlled Experiment." Petrophysics—The SPWLA Journal of Formation Evaluation and Reservoir Description 62.04 (2021): 407-421.

Ramakrishna, Sandeep, Dick Merkel, and Ron Balliet. "Mineralogy, Porosity, and Fluid Property Determination of Oil Reservoirs of the Green River Formation In the Uinta Basin." SPWLA 53rd Annual Logging Symposium. OnePetro, 2012.

Stroud, D., G. W. Milton, and B. R. De. "Analytical model for the dielectric response of brine-saturated rocks." Physical Review B 34.8 (1986): 5145.

Ellis, Darwin V., and Julian M. Singer. Well logging for earth scientists. vol. 692. Dordrecht: Springer, 2007.

* cited by examiner

COMBINED PROCESSING OF BOREHOLE IMAGERS AND DIELECTRIC TOOLS

FIELD OF THE INVENTION

The present disclosure relates to a system and methods for imaging and measuring a subsurface formation using well logging tools, and more specifically to using a borehole imager in combination with a dielectric tool to obtain geologic images and measure petrophysical properties of a subsurface formation surrounding a wellbore in order to characterize subsurface reservoirs within the subsurface formation.

BACKGROUND

Hydrocarbon recovery from subsurface formations benefits from formation evaluation and, more specifically, reservoir characterization. Formation evaluation may involve drilling a wellbore into the subsurface formation before inserting one or more well-logging tools into the wellbore to extract and log information about the structure and characteristics of the subsurface formation and wellbore. For example, geologic imaging may enable identification of petrophysical properties and potential hydrocarbon production zones in the subsurface formation and particularly around the wellbore. This information about the subsurface formation and wellbore enables, for example and without limitation, improved production of hydrocarbons during the well completion process by enabling hydrocarbon analysts to, for example, better understand what kind of fluids are present within the formation, saturation levels of these fluids, and how these fluids may move during well completion operations.

Well-logging tools record properties of the subsurface formation and wellbore. These tools may comprise one or more transmitters and one or more receivers. The one or more transmitters may stimulate electrical currents into the subsurface formation and the one or more receivers may also detect electrical currents in response to the transmitter-stimulated electrical currents. A log may be used to store the electrical data captured at the receivers and the data contained therein may be processed to extract various features. For example, dispersion (variation with frequency) of the formation permittivity and formation conductivity may be used to solve for petrophysical parameters using a mixing law. Well-logging tools may comprise a dielectric tool and the dielectric tool may be a single frequency tool that may limit determination of dispersion curves of permittivity and conductivity in the subsurface formation. Furthermore, a dielectric tool may measure a subsurface formation at a single azimuthal location and at a given depth and, therefore, may not be able to provide an image of the formation. Additionally, certain well-logging tools may only operate at specific frequencies and, therefore, may limit determination of subsurface formation features, including, for example, and without limitation, dispersion across multiple frequencies.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features.

Figure 1B:
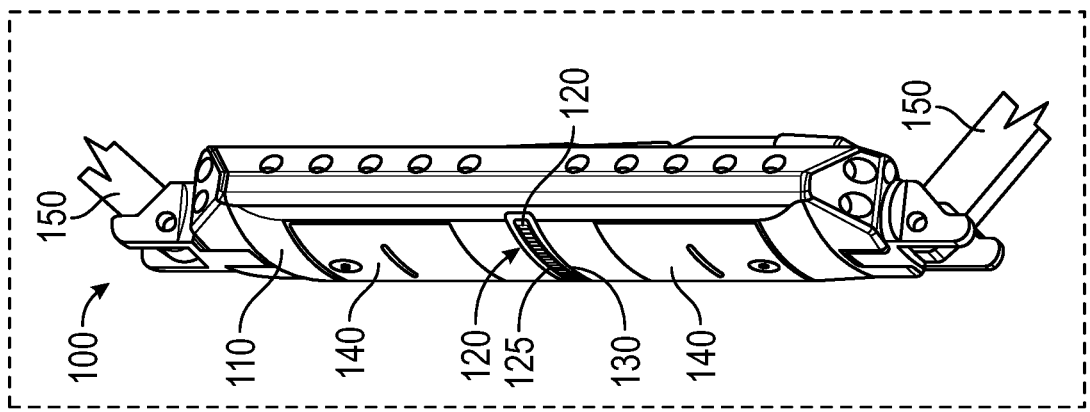
FIGS. 1A-B depicts a pad of an exemplary borehole imager.

While embodiments of this disclosure have been depicted and described and are defined by reference to exemplary embodiments of the disclosure, such references do not imply a limitation on the disclosure and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only and are not exhaustive of the scope of the disclosure.

DETAILED DESCRIPTION

The present disclosure relates to a system and methods for imaging and measuring a subsurface formation using well logging tools, and more specifically to using a borehole imager tool in combination with a dielectric tool to obtain geologic images and measure petrophysical properties of a subsurface formation surrounding a wellbore in order to characterize subsurface reservoirs within the subsurface formation.

Described herein is a technique for combining subsurface formation porosity information corresponding to dielectric tool measurements with textural information corresponding to information from a borehole imager. Dielectric logging tools may be particularly important for evaluating high-resistivity reservoirs, for example, and without limitation, carbonate formations, as well as unconventional reservoirs, for example, and without limitation, shale formations. For example, dielectric tools may be used to determine water-filled porosity and water salinity. These parameters may in turn be used to determine water saturation, water resistivity and the texture exponent mn in Archie's Law. A dielectric tool, and more specifically a high frequency dielectric tool, may provide measurements at a single frequency, and thus, may not resolve textural parameters of a subsurface formation. Furthermore, it may be desirable to get an image of the porosity of the formation along with the textural parameters to better understand and characterize the subsurface formation to improve well completion. Additionally, it may be desirable to combine formation textural parameters with the resistivity of the formation to improve identification of subsurface rock types of the formation.

Imaging properties are used herein as an umbrella term for formation properties, including but not limited to formation permittivity and formation resistivity, mud properties, including but not limited to mud permittivity and mud resistivity, and standoff. Water salinity will be assumed to be a constant (and equal to the value determined from the dielectric tool) in the description, but in a more general implementation, salinity may be assumed to be varying as well. Additionally, permittivity, as used herein, is synonymous with dielectric constant.

In one or more aspects of the present disclosure, a wellbore environment may utilize an information handling system to control one or more operations associated with the wellbore environment. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. The information handling system may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a sequential access storage device (for example, a tape drive), direct access storage device (for example, a hard disk drive or floppy disk drive), compact disk (CD), CD read-only memory (ROM) or CD-ROM, DVD, RAM, ROM, electrically erasable programmable read-only memory (EE-PROM), and/or flash memory, biological memory, molecular or deoxyribonucleic acid (DNA) memory as well as communications media such wires, optical fibers, microwaves, radio waves, and other electromagnetic and/or optical carriers; and/or any combination of the foregoing.

Illustrative embodiments of the present disclosure are described in detail herein. In the interest of clarity, not all features of an actual implementation may be described in this specification. It will of course be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

Throughout this disclosure, a reference numeral followed by an alphabetical character refers to a specific instance of an element and the reference numeral alone refers to the element generically or collectively. Thus, as an example (not shown in the drawings), widget "1a" refers to an instance of a widget class, which may be referred to collectively as widgets "1" and any one of which may be referred to generically as a widget "1". In the figures and the description, like numerals are intended to represent like elements.

To facilitate a better understanding of the present disclosure, the following examples of certain embodiments are given. In no way should the following examples be read to limit, or define, the scope of the disclosure. Embodiments of the present disclosure may be applicable to drilling operations that include but are not limited to target (such as an adjacent well) following, target intersecting, target locating, well twinning such as in SAGD (steam assist gravity drainage) well structures, drilling relief wells for blowout wells, river crossings, construction tunneling, as well as horizontal, vertical, deviated, multilateral, u-tube connection, intersection, bypass (drill around a mid-depth stuck fish and back into the well below), or otherwise nonlinear wellbores in any type of subsurface formation. Embodiments may be applicable to injection wells, and production wells, including natural resource production wells such as hydrogen sulfide, hydrocarbons or geothermal wells; as well as wellbore or borehole construction for river crossing tunneling and other such tunneling wellbores for near surface construction purposes or wellbore u-tube pipelines used for the transportation of fluids such as hydrocarbons. Embodiments described below with respect to one implementation are not intended to be limiting.

Figure 1A:
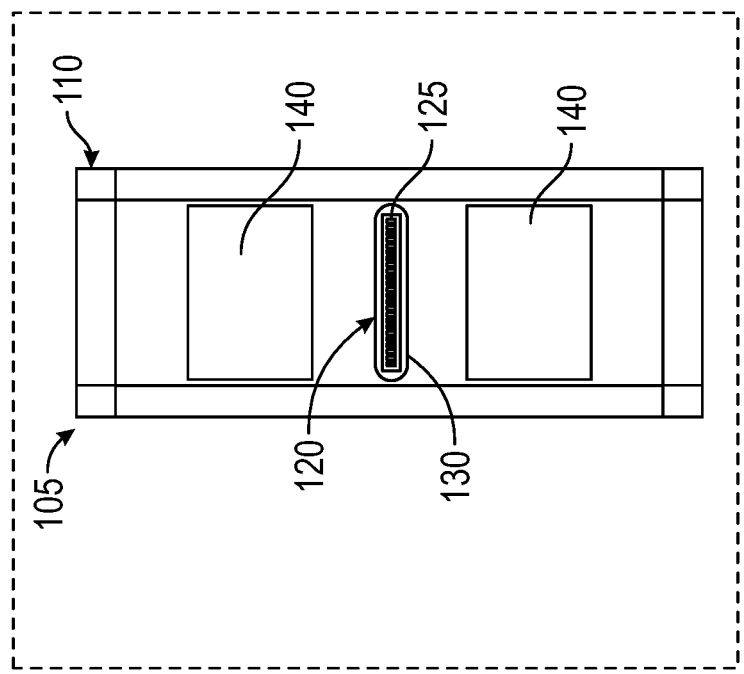

FIGS. 1A-B depict a pad 105 of an exemplary borehole imager. Pad 105 may serve to place button array 120 and/or return electrode 140 in contact with or close proximity to a borehole within a subsurface formation. See FIGS. and 10, 11A-B. Pad 105 may comprise a button array 120, a return electrode 140, a guard 130, and a housing 110. In one or more embodiments, pad 105 may comprise a plurality of button arrays 128. In one or more embodiments, pad 105 may comprise any suitable number of button electrodes 125 within any number of button arrays 120 that may enable production of a desired current. A button electrode 125 may be an electrode for sensing impedance in one or more of pad 105 and a downhole tool 1002. See FIGS. 10 and 11A-B. In one or more embodiments, the downhole tool 1002 may comprise a plurality of pads 105.

In one or more embodiments, pad 105 may comprise a plurality of return electrodes 140. For example and without limitation, a first electrode 130 may be disposed on one side of button array 120, and a second return electrode 130 may be disposed on the opposite side of button array 120. These return electrodes 140 may be disposed at equal distances away from button array 120 or at varying distances from button array 120. In one or more embodiments, a voltage difference between button array 120 and return electrodes 140 may be applied, which may cause currents to be emitted from button array 120 into the mud (not shown) and formation 1004. See FIGS. 10 and 11A-B.

In one or more embodiments, an operator may energize button array 120 during operations. A voltage may be applied between each button electrode 125 and return electrode 140. The level of the voltage may be controlled by an information handling system. See FIGS. 10, 11A-B, 12. This may cause currents to be transmitted through button array 120. These currents may travel through mud (not shown) and formation 1004 before returning to electrode 140. The amount of current emitted by each button electrode 125 may be inversely proportional to an impedance detected by that button electrode 125. This impedance may be affected by the properties of formation 1004 and the mud in close proximity to button electrodes 125. Current emitted by each button electrode 125 may be measured and recorded in order to obtain an image of the resistivity of formation 1004. In one or more embodiments, pad 105 may enable one or more measurements at one or more locations in a borehole 1002 of a subsurface formation 1004. See FIGS. 10 and 11A-B. In one or more embodiments, the one or more measurements at one or more locations in the borehole 1002 of the subsurface formation 1004 may enable construction of an image of and around the one or more measured locations within borehole 1002 and of the formation 1004 surrounding borehole 1002. Drilling, logging, completion, and or production parameters may then be adjusted based on the constructed image. In one or more embodiments, a voltage drop across one or more of button electrodes 125 within button array 120 may be measured and used to estimate the impedance of formation 1004.

In one or more embodiments, pad 105 may comprise guard 130, which may enable focusing of the current produced by button array 120 into formation 1004 radially. In one or more embodiments, guard 130 may be disposed around button array 120. In one or more embodiments, guard 130 may include the same potential as button array 120.

In one or more embodiments, housing 110 of pad 105 may serve to protect button array 120 and return electrodes 140 from the surrounding mud and formation 1004. See also FIG. 10. Housing 110 may be made with any suitable material. For example and without limitation, suitable material for the housing 110 may be any one or more of metals, nonmetals, plastics, ceramics, composites, and combinations thereof. In one or more embodiments, housing 110 may be a metal plate. In one or more embodiments, housing 110 may be connected through an arm 150 to downhole tool 1002. See also FIG. 10.

In one or more embodiments, borehole imager may be a resistivity imager. In one or more embodiments, an impedance value may be calculated through the current transmitting between a button electrode and formation 1004 for each button electrode 125. The voltage between button array 120 and return electrodes 140 may be measured and divided by the transmitted current to produce a value for the impedance seen by each button electrode 125. In one or more embodiments, impedance measurements may be used to solve for the direct current (DC) conductivity and the real and imaginary parts of permittivity of the subsurface formation 1004 as well as a standoff value at each of the one or more measurements, where the standoff is the distance from the pad 105 to the formation 1004. In practice, the effects of the DC conductivity and the imaginary part of the permittivity may be only distinguishable through the fact that the former does not depend on frequency. In one or more embodiments, the one or more measurements may enable determination of one or more properties of the mud within borehole 1002. In one or more embodiments, these mud properties may be calculated from the measured impedances of the electrical currents received at the one or more return electrodes 140. In one or more embodiments, one or more of an iterative inversion process and a machine learning process may be used to calculate the mud properties. See FIG. 2. In one or more embodiments, the borehole imager may operate at multiple frequencies. Because skin depth of the electromagnetic waves varies with frequency, depth of investigation of the tool is different at different frequencies (that is, the electromagnetic fields emitted by the tool are able to penetrate further into the formation at lower frequencies and will penetrate less at higher frequencies). This allows the tool to obtain measurements from different radial depths and thereby enable creation of a radial profile—that is a profile that varies with depth—of the texture parameter.

In one or more embodiments, a plurality of measurements of subsurface formation 1004 at a plurality of frequencies may be separated into two sets. The first set of impedance measurements of the subsurface formation 1004 may be used to solve for the real component of the formation permittivity and the second set of impedance measurements of the subsurface formation 1004 may be used to solve for the imaginary component of the formation permittivity (and the DC conductivity).

Figure 2:
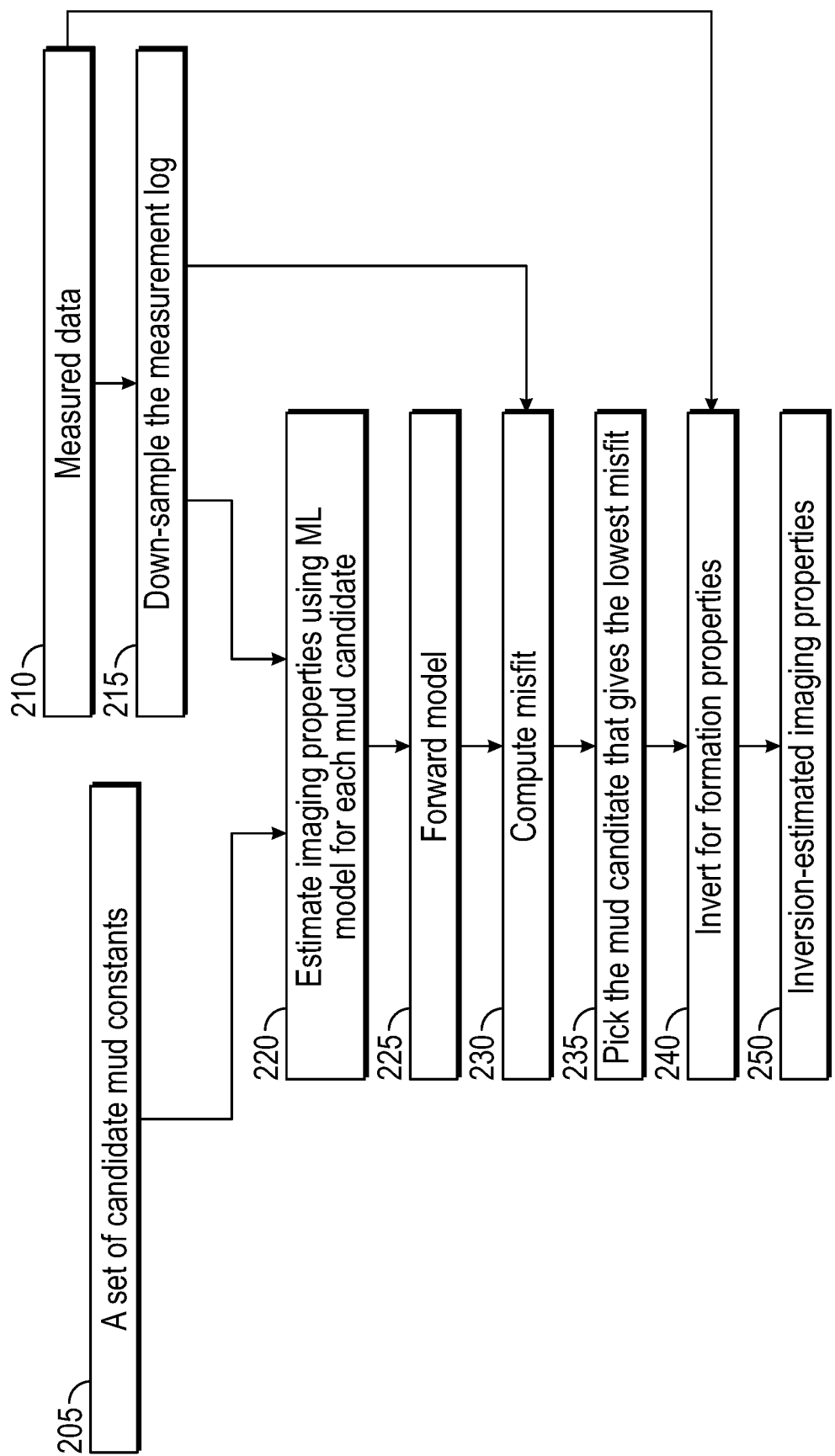
FIG. 2 depicts an exemplary flow diagram illustrating a method for determining mud permittivity, mud resistivity, formation permittivity, formation resistivity and standoff using borehole imager data for a subsurface reservoir using iterative inversions and machine learning.

FIG. 2 depicts an exemplary flow diagram illustrating a method for determining mud permittivity, mud resistivity, formation permittivity, formation resistivity, and standoff using borehole imager data for a subsurface reservoir using iterative inversions and machine learning. In one or more embodiments, an iterative inversion process and a machine learning process may be combined in a single framework. A set of machine-learning models may be trained for different mud candidates and stored for later use. A mud candidate may comprise one or more mud properties and constants, including but not limited to mud permittivity, mud resistivity, and mud angle, where the mud angle may comprise the phase angle of the mud impedance in the complex plane. In one or more embodiments, a set of mud candidates 205 may comprise permutations of values of one or more of the mud properties and constants. In one or more embodiments, values of the one or more of the mud properties may be discretized. In one or more embodiments, the values of the one or more of the mud properties may correspond to historic data.

Once a well is logged, for example, using the borehole imager 100 of FIGS. 1A-B, the measured data 210 may be downsampled (step 215). In one or more embodiments, downsampling may reduce subsequent processing associated with downsampled data. The term downsampling is used rather broadly herein and may refer to one or more of the selection of certain measurement data sets. For example and without limitation, downsampling may comprise selecting measurements from zones that have larger sensitivity to mud (for example and without limitation, low-resistivity zones) and decimation of the data. In one or more embodiments, the set of mud candidates and the downsampled measured data from step 215 may be provided to a machine learning algorithm (step 220) to train machine-learning models for each mud candidate to produce a set of imaging properties. In one or more embodiments, imaging properties for each mud candidate may be used as inputs to a forward model (step 225). The output of the forward model from step 225 may be compared with the downsampled measured data from step 215 to determine a value for the misfit between the forward model and downsampled measured data. For each of the forward models, a misfit between the forward model and the downsampled measured data is calculated in step 230. In step 235, the mud properties corresponding to the mud candidate that produces the lowest misfit between the reconstructed response from the forward model and the downsampled measured data may be selected as the optimum mud properties. This process may be summarized by:

$$\arg_{\overline{X}} \min \langle \| \overline{R} - \overline{R}^M(\overline{X}) \| \rangle \qquad \text{Equation 1}$$

where $\overline{X}$ denotes a mud candidate, $\overline{R}$ is the measurement vector for each pixel, and $\overline{R}^M(\overline{X})$ is the reconstructed response corresponding to that mud candidate. The overbar denotes a vector quantity. Double vertical bars denote the norm operation. In one or more embodiments, the norm may be found for each pixel (where a pixel corresponds to a measurement location), and the results may be averaged (where the angle brackets denote the expected value operation). In Equation 1, the recursion over each pixel is not explicitly shown for conciseness of notation.

In one or more embodiments, step 240 of the hybrid process may comprise inversion to determine one or more imaging properties, assuming mud properties are known and equal to the optimum mud properties determined by the machine-learning techniques. Full-resolution data may be used as input to the inversion, and the imaging properties may be determined for each pixel of the measured data.

In one or more embodiments, imaging properties may be visualized on a display and used for petrophysical analysis of the formation by an analyst. In one or more embodiments, the imaging properties may be portrayed as a two dimensional image portraying the mud and formation around a wellbore as, for example, an unrolled cylinder. An analyst may use the imaging properties to identify one or more of the presence and location of one or more stratigraphical features of the formation, including but not limited to formation dip, thin beds, fractures, and washout zones. The presence and location of these one or more stratigraphical features of the formation enables the analyst to evaluate the formation and characterize any reservoirs within the formation and thereby improve well completion.

Figure 3:
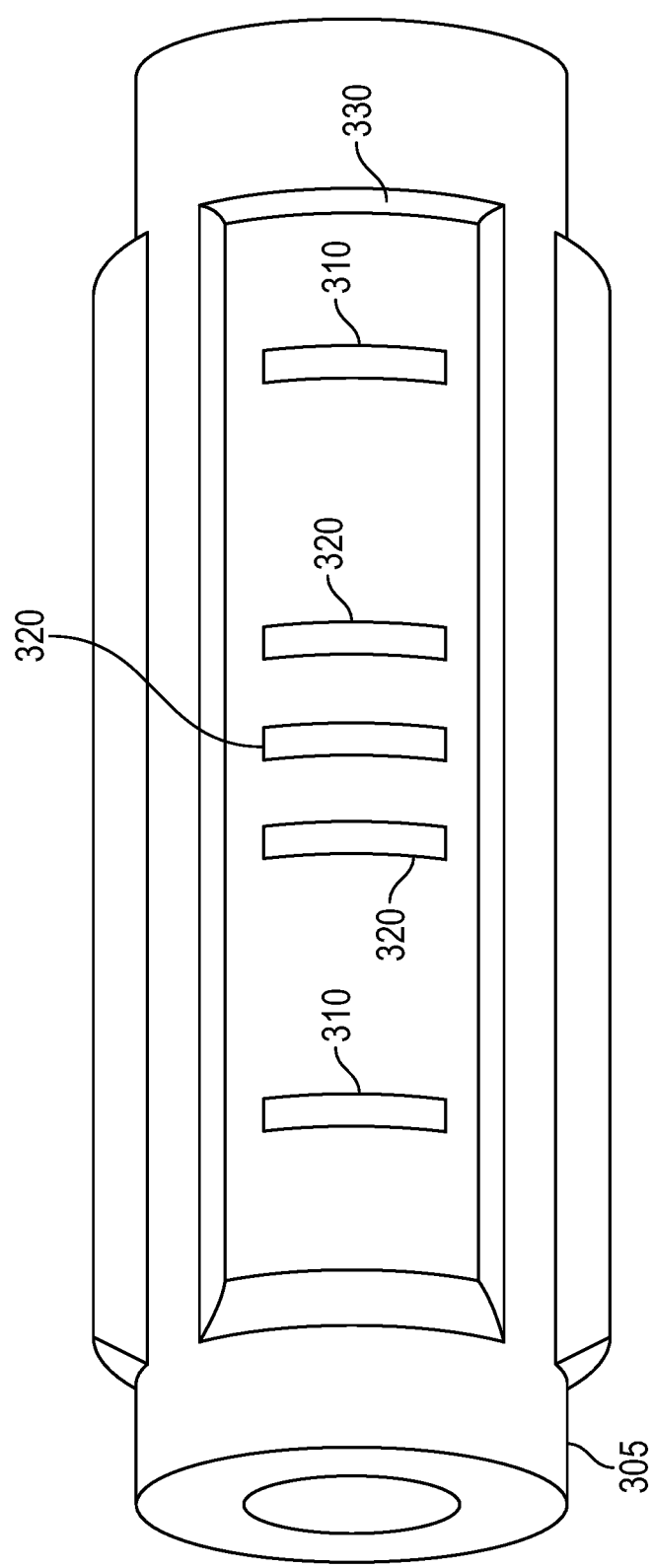
FIG. 3 depicts an exemplary dielectric tool.

FIG. 3 depicts an exemplary dielectric tool 305. As noted herein, dielectric logging tools may enable evaluation of high-resistivity reservoirs, including but not limited to carbonate formations, as well as unconventional reservoirs, including but not limited to reservoirs in shale formations. Dielectric tools may be used to determine water-filled porosity and water salinity. In turn, water-filled porosity and water salinity may be used to determine a formation's water saturation, water resistivity, and texture exponent mn in Archie's Law. In one or more embodiments, a dielectric tool 305 may enable measurement of the attenuation and phase of an electromagnetic signal propagating near a borehole wall in a subsurface formation. In one or more embodiments, the dielectric tool 305 may operate at gigahertz (GHz) frequencies. A dielectric tool 305 may comprise one or more antennas, including but not limited to horn antennas, and these antennas may be used to transmit, receive, or both transmit and receive electromagnetic waves. In one or more embodiments, a dielectric tool 305 may comprise one or more transmitters and one or more receivers. As depicted in FIG. 3, a dielectric tool 305 may comprise a logging-while-drilling tool comprising two transmitters 310 and three receivers 320 and a stabilizer 330; however, no limitations are intended to the details of construction or design. In one or more embodiments, a dielectric tool may be a wireline tool. In one or more embodiments, a dielectric tool may comprise one or more pads. Using a plurality of transmitters 310 and a plurality of receivers 320, a dielectric tool 305 may make measurements at multiple depths of investigation within a subsurface formation. One potential limitation of dielectric tools may be that that measurements of the subsurface formation may be from a single azimuth at a given depth. In contrast, a resistivity imager tool may obtain multiple measurements in the azimuthal direction (i.e. circumferential direction) due to the presence of multiple button electrodes and/or multiple pads. Therefore, a dielectric tool may not provide azimuthal coverage in contrast to a resistivity imager.

In one or more embodiments, the dielectric tool may enable determination of the apparent permittivity and apparent resistivity of the subsurface formation using attenuation and phase measurements of the subsurface formation and a mapping algorithm. As used herein, the term "apparent" here denotes quantities measured by the dielectric tool and may not directly correspond to the properties of a single material (such as water or the rock matrix.) That is, the apparent values may be impacted by one or more environmental factors. The apparent complex permittivity ($\varepsilon_{app}^*$) may then be represented as the sum of the real and imaginary components and obtained as:

$$\varepsilon_{app}^* = \varepsilon_{app}' + i\frac{1}{\omega\varepsilon_0 \sigma_{ap}} \qquad \text{Equation 2}$$

In Equation 2, $\omega$ is the angular frequency and $\varepsilon_0$ is the permittivity of the free space, and $\sigma_{ap}$ is the apparent conductivity at the operating frequency of the tool (which contains the combined effects of the imaginary part of the permittivity and the DC conductivity.). As mentioned above, apparent complex permittivity ($\varepsilon_{app}^*$) may not correspond to the permittivity of a particular material and may, in general, be a function of multiple variables, which may include the following as shown in Equation 2: complex permittivity of the rock matrix ($\varepsilon_{ma}^*$), water-filled porosity ($\phi_w$), complex permittivity of water ($\varepsilon_w^*$), complex permittivity of the hydrocarbons in the formation ($\varepsilon_{hc}^*$), total porosity ($\phi_T$), and the textural parameters such as the mn texture exponent.

$$\varepsilon_{app}^* = M(\varepsilon_{ma}^*, \phi_w, \varepsilon_w^*, \varepsilon_{hc}^*, mn, \ldots) \qquad \text{Equation 3}$$

In one or more embodiments, a rock-physics interpretation model may enable correlation of the apparent permittivity to one or more of the variables of Equation 3 discussed above. One of the most widely used such model is the complex refractive index model (CRIM). Other models include the complex time average (CTA) model, and the time propagation (TPO) method. The CRIM may be highly accurate in the GHz range.

Using the CRIM, $\varepsilon_{app}^*$ may be expressed as:

$$\sqrt{\varepsilon_{app}^*} = \phi_w \sqrt{\varepsilon_w^*} + (1-\phi_T)\sqrt{\varepsilon_{ma}^*} + (\phi_T - \phi_w)\sqrt{\varepsilon_{hc}^*} \qquad \text{Equation 4}$$

In one or more embodiments, some of the parameters in Equation 4 may be known through other means. For example, ($\phi_T$ may be obtained from density-nuclear logging or nuclear magnetic resonance (NMR) logging. The permittivity of the water may be modeled as a function of water salinity ($X_{sal}$), pressure (P), and temperature (T) as shown in Equation 4. One such model is the solvation model based on density (SMD).

$$\varepsilon_w^* = W(T, X_{sal}, P) \quad \text{Equation 5}$$

Equation 4 provides two equations (for real and imaginary parts of the complex numbers) with two unknowns ($\phi_w$ and $X_{sal}$), when assuming all other unknowns may be identified through supplemental measurements. Accordingly, these two equations may be solved to resolve the two unknowns.

Archie's Law, shown in one form in Equation 6, may be used to define the textural parameters.

$$\phi_W^{mn} = a \frac{\sigma_{ap}}{\sigma_w} \quad \text{Equation 6}$$

In Equation 6, $\sigma_w$ is the conductivity of water, $\sigma_{ap}$ is the measured (apparent) conductivity, and a and mn are empirical constants, where $\alpha$ is called the tortuosity factor and mn is the texture exponent. By fitting a selected mixing law which predicts the apparent response of a medium as a function of its constituent components including hydrocarbons, water and the rock matrix to the measured dispersion curve (that is, the variation of parameters with frequency), it may be possible to solve for textural parameters of the subsurface formation. See FIG. 5. The mixing law may further enable solving for $\sigma_w$ and $X_{sal}$ as mentioned with respect to Equation 5.

Figure 4:
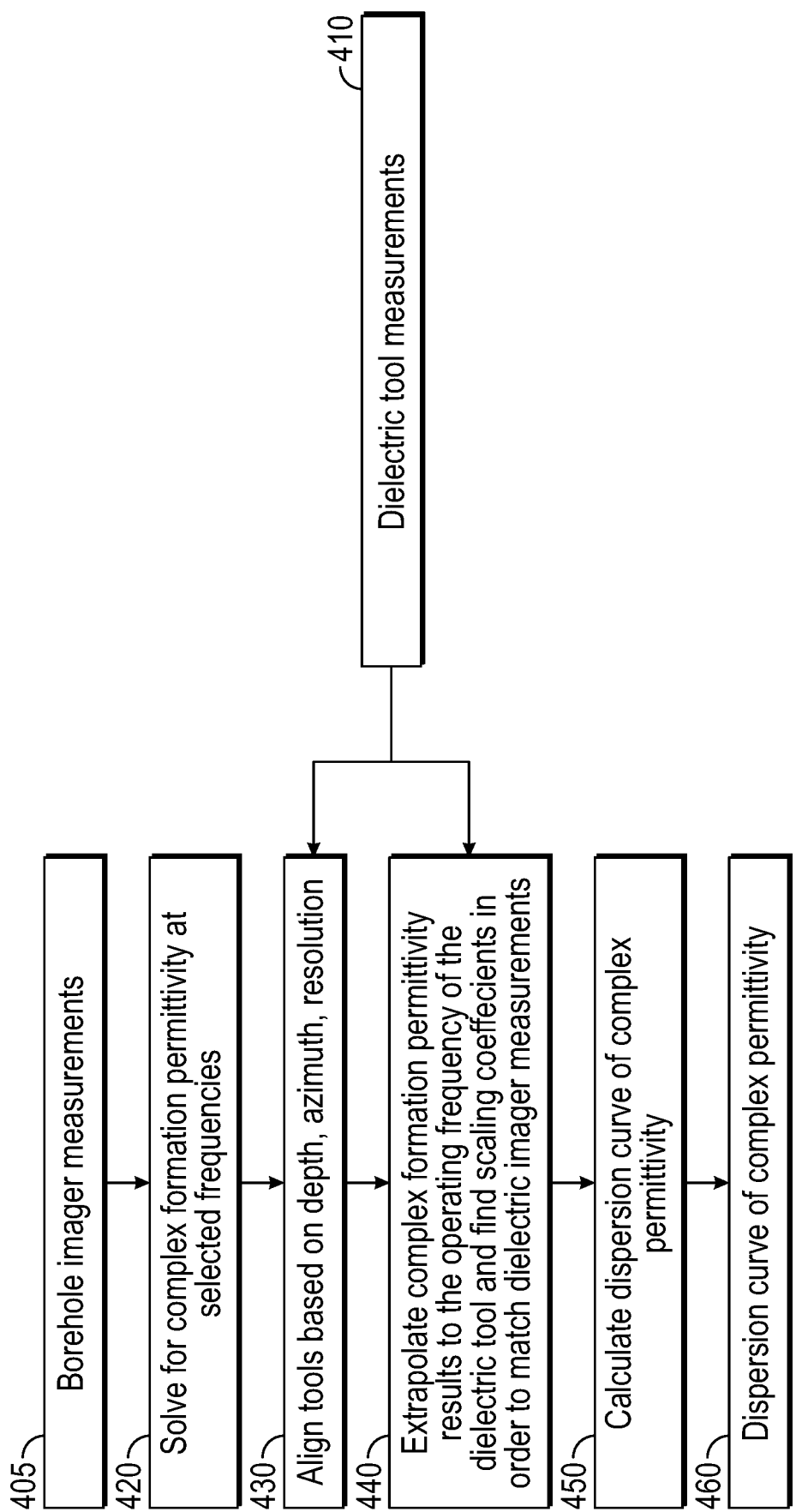
FIG. 4 depicts an exemplary flow diagram illustrating a method for obtaining a dispersion curve describing a subsurface formation based on measurements from a borehole imager and a dielectric tool.

FIG. 4 depicts an exemplary flow diagram illustrating a method for obtaining a dispersion curve describing a subsurface formation based on measurements from a borehole imager and a dielectric tool. In one or more embodiments, a quantitative solution technique in step 420 may be provided resistivity measurements 405 from a borehole imager, such as, without limitation, a resistivity imager, and used to solve for the apparent permittivity of a subsurface formation at the frequencies of operation of the borehole imager. In one or more embodiments, the quantitative solution technique may comprise the hybrid method described in FIG. 2. In step 430, measurements from a dielectric tool 410 may be aligned with the outputs of the quantitative solution technique from step 420. In one or more embodiments, this alignment may comprise one or more of depth alignment, azimuthal alignment, and alignment of the resolution or scale of the borehole imager measurement data and the dielectric tool measurement data.

In one or more embodiments, the borehole imager and the dielectric tool may reside in different positions on the LWD/MWD and/or wireline tool string and may be used to simultaneously log measurements of one or more of the subsurface formation and the wellbore. In one or more embodiments, the difference in positioning on the tool string may require depth alignment to properly correlate the two sets of measurements. In one or more embodiments, a speed correction algorithm may be needed to accommodate differences in the speed of the tools. In one or more embodiments, the borehole imager and the dielectric tool may be positioned on the tool string at separate times and may be used to log measurements of one or more of the subsurface formation and the wellbore in separate runs of the tool string through the wellbore within the subsurface formation.

In one or more embodiments, additional data processing steps may be required (not shown). For example and without limitation, measurements of the subsurface formation using a borehole imager may be converted from one or more of raw voltages and currents to one or more of impedances and resistivities. Similarly, measurements of the subsurface formation using a dielectric tool may be mapped to a permittivity, using, for example and without limitation, Equation 3. In step 440, permittivity values obtained at the operating frequencies of the borehole imager may be extrapolated to the operating frequency of the dielectric tool and may be scaled to match the permittivity measured by the dielectric tool. See also FIG. 6. In step 450, the scaled permittivity values of the borehole imager may be used to obtain a dispersion curve of permittivity 460.

Figure 5:
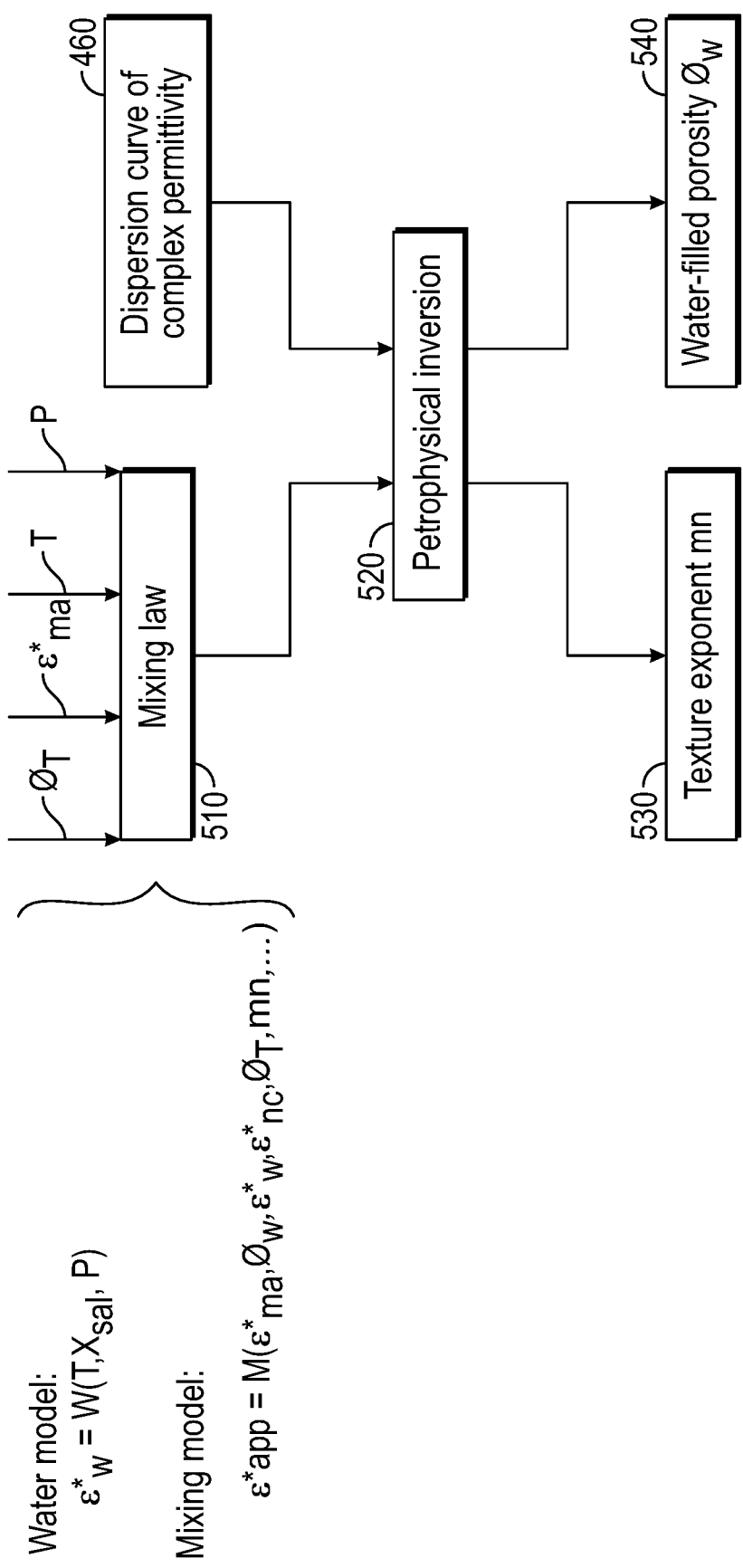
FIG. 5 depicts an exemplary flow diagram illustrating a method for calculating the texture exponent mn and the water-filled porosity $\phi_w$ of a subsurface formation using the dispersion curve of permittivity and a mixing law.

FIG. 5 depicts an exemplary flow diagram illustrating a method for calculating the texture exponent mn and the water-filled porosity $\phi_w$ of a subsurface formation using the dispersion curve of permittivity and a mixing law. In one or more embodiments, dispersion curve of permittivity 460 and a mixing law 510 are inputs to a petrochemical inversion 520 that outputs the texture exponent mn 530 and the water-filled porosity $\phi_w$ 540 of a subsurface formation. In one or more embodiments, the petrochemical inversion 520 may be an interative inversion algorithm. In one or more embodiments, parameters of the mixing law 510, such as $\phi_T$, $\varepsilon_{ma}^*$, T, and P, may be determined via one or more auxiliary measurements. The goal of the petrophysical inversion 520 may be to find texture exponent mn 530 and water-filled porosity $\phi_w$ 540 that minimize a cost function. In one or more embodiments, the cost function may be the norm of the difference between the modeled apparent permittivity and the measured apparent permittivity, as shown in Equation 6. In Equation 7, the measured and modeled apparent permittivities are distinguished by the labels in their subscripts. $\overline{X}$ denotes the parameter vector of the model to obtain the modeled apparent permittivity. In one or more embodiments, the cost function may comprise one or more regularization terms, including but not limited to measured or known information about the subsurface formation, to reduce the effect of the noise and produce a smoother answer product.

$$\arg_{\overline{X}} \min \| \varepsilon_{app,Meas}^* - \varepsilon_{app,Model}(\overline{X}) \| \quad \text{Equation 7}$$

Figure 6:
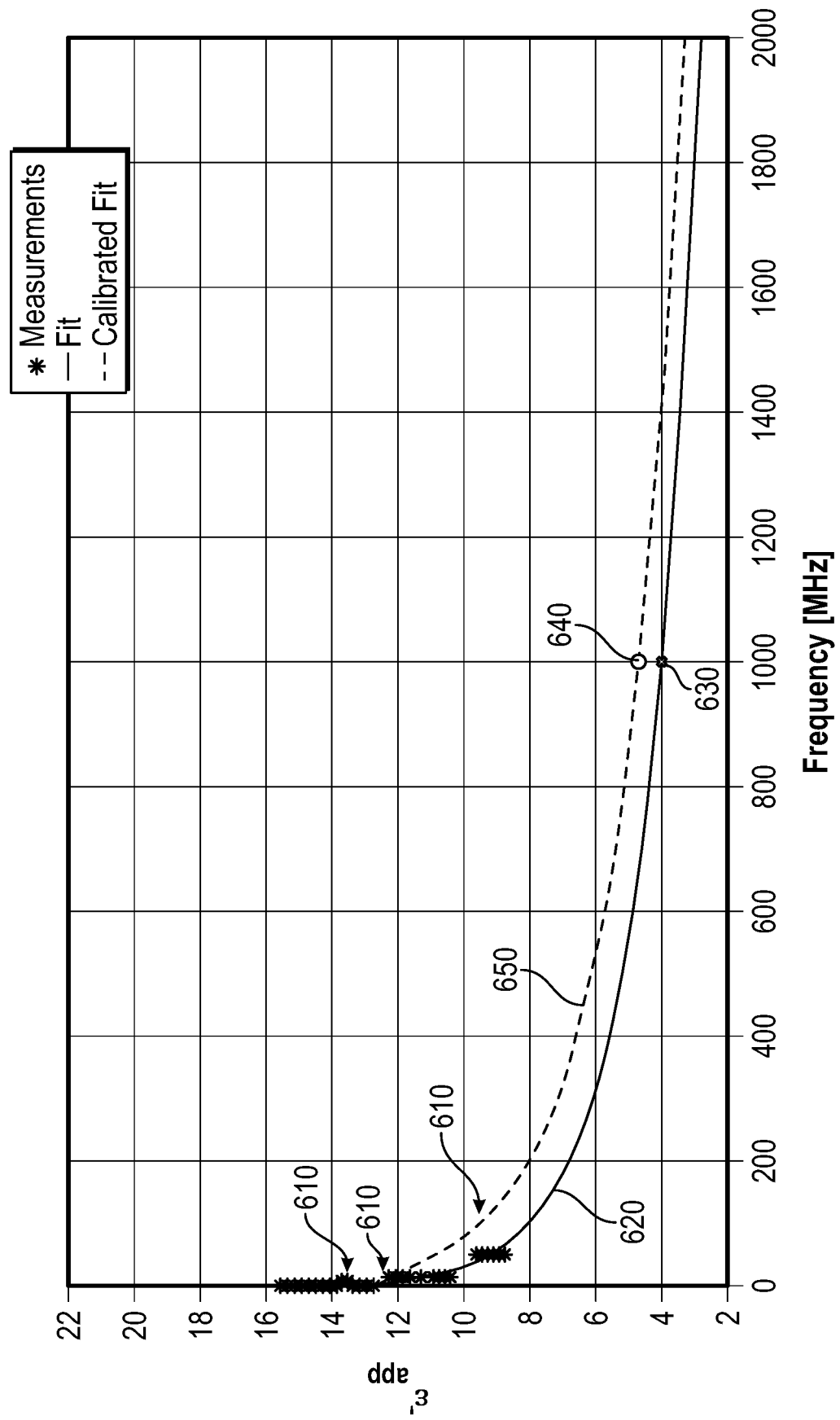
FIG. 6 depicts exemplary results of an exemplary method for scaling the measured and modeled permittivity of the subsurface formation based, at least in part, on permittivity measurements of a dielectric tool and the measurements of the borehole imager.

FIG. 6 depicts the results of an exemplary method for scaling the measured and modeled permittivity of the subsurface formation based, at least in part, on permittivity measurements of a dielectric tool and the measurements of the borehole imager. In one or more embodiments, a curve fit may be applied to the obtained dispersion curve of permittivity 460. The curve fit may be determined by, for example, grouping measured data from the dielectric tool based on measured data with similar porosity, salinity, and formation permittivity values, which may enable improved accuracy for the curve fit. FIG. 6 illustrates the real part of the apparent permittivities, as solved for at selected frequencies, per step 420 of FIG. 4 and based on the borehole imager measurements 410, as asterisk signs 610 along the y-axis. While not shown in FIG. 6, the imaginary part of the apparent permittivity (which includes a contribution from the formation resistivity) may be processed similarly. In one or more embodiments, the fitted curve may be a polynomial of a given degree and the coefficients of the polynomial may be determined using a least squares solution. In FIG. 6, the curve showing the real part of the apparent permittivity, as fitted to the data, is shown as the solid line 620. In one or more embodiments, the value of the curve at the operating frequency of the dielectric tool may be determined or extrapolated. The extrapolated value is shown as the X 630 at 1000 MHz along the solid line 620 in FIG. 6. An average value of the permittivity measured by the dielectric tool corresponding to the borehole imager measurements may also be found and is shown as the circle 640 above the X 630 at 1000 MHz. In one or more embodiments, a ratio of the average permittivity measured by the dielectric tool across multiple frequencies to the extrapolated permittivity as determined by the curve fitting process may be calculated and the whole curve may be multiplied by this ratio to scale the original curve fit for permittivity 460 and create the final dispersion curve, shown as the black dashed line 650. The scaling operation assumes the error between the imager tool and the dielectric tool in FIG. 6 is multiplicative. However, in one or more embodiments, the scaling operation may be additive, where the fitted curve may be shifted up or down based on the difference between the average dielectric tool measurements and the extrapolated resistivity results (not shown).

Figure 7C:
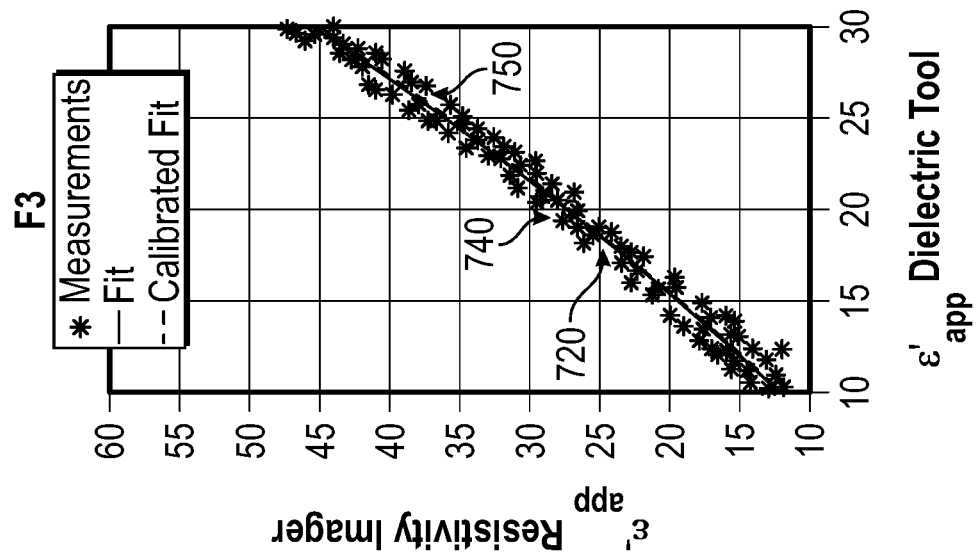
FIGS. 7A-7C depict exemplary cross-plots of the apparent permittivity as measured by the dielectric tool and the borehole imager with reference measurements.
Figure 7B:
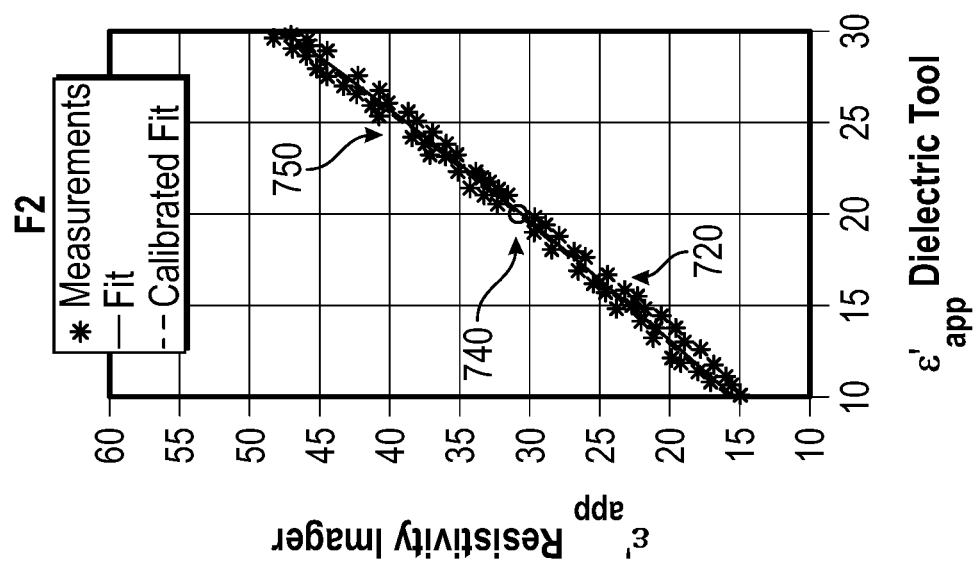
Figure 7A:
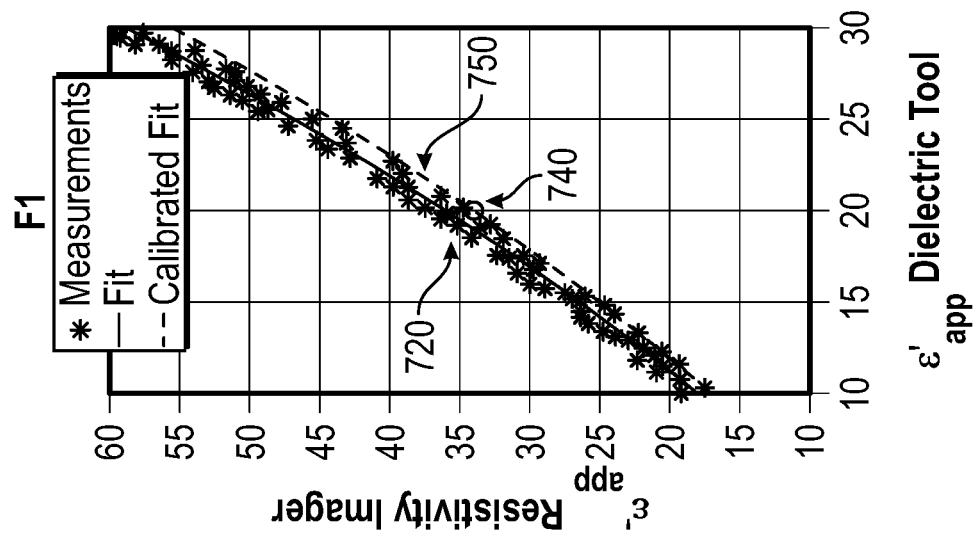

FIGS. 7A-7C depict exemplary cross-plots of the apparent permittivity as measured by the dielectric tool and the borehole imager with reference measurements. Extrapolation as shown in FIG. 6 may be prone to large errors due to differences between the operating frequency of the dielectric tool and the borehole imager. Accordingly, in one or more embodiments, another method to scale permittivities of the borehole imager may be desirable. In FIGS. 7A-7C, a cross-plot of the formation permittivity, based on a quantitative solution of the borehole imager measurements (as compared with the formation permittivity determined by the dielectric tool used in FIG. 6) may be plotted for each frequency of the borehole imager tool. In FIGS. 7A-7C, the first frequency F1 is shown in FIG. 7A, the second frequency F2 is shown in FIG. 7B, and the third frequency F3 is shown in FIG. 7C. In one or more embodiments, a curve fitting method may be used to fit a polynomial of a given degree to the data for each frequency. This fitted curve is shown with by the solid lines in FIGS. 7A-7C. In one or more embodiments, this fit may minimize a cost function. In one or more embodiments, the cost function may be the mean square error between the borehole imager measurements and the curve. With all frequencies of the borehole imager scaled, the scaled data may be used to solve for the dispersion of the formation permittivity and resistivity. In one or more embodiments, the methods of FIGS. 7A-7C may be more accurate than the method of FIG. 6, but may require a large number of reference measurements to be made.

In one or more embodiments, reference measurements for a variety of rock types, porosities, water salinities, temperatures and pressures at the operating frequencies of the borehole imager and the dielectric tool may be made. In one or more embodiments, the reference measurements may be made by any tool capable of measuring the permittivity. In one or more embodiments, the tool capable of measuring the permittivity may be a vector network analyzer. In one or more embodiments, the curve fitting process may be simplified by assuming a certain type of subsurface formation where measurements are taken from points with similar properties for simplicity. In practice, it may be more accurate to scale the permittivity curves separately for each zone or region with differing formation characteristics. In one or more embodiments, it may be beneficial to assume a reference measurement exists for each frequency (shown as a circle 740 near the center of each of FIGS. 7A-7C) and the reference measurement may be used to scale the curves in a multiplicative or additive manner, as discussed herein. Note that the dashed lines 750 in FIGS. 7B and 7C align almost perfectly with the solid lines 720. Scaled curves assuming a multiplicative scaling are shown in FIGS. 7A-7C as dashed lines. In one or more embodiments, multiple measurements from a reference tool may exist for a given formation type, which may enable more complicated scaling techniques, including without limitation piecewise linear scaling.

In one or more embodiments, it may be beneficial to generate separate sets of measurement data to determine dispersion curves of the formation permittivity at different operational frequencies of the borehole imager because measurements at lower frequencies may be more sensitive to the formation resistivity while higher frequencies may be more sensitive to the formation permittivity.

Figure 8:
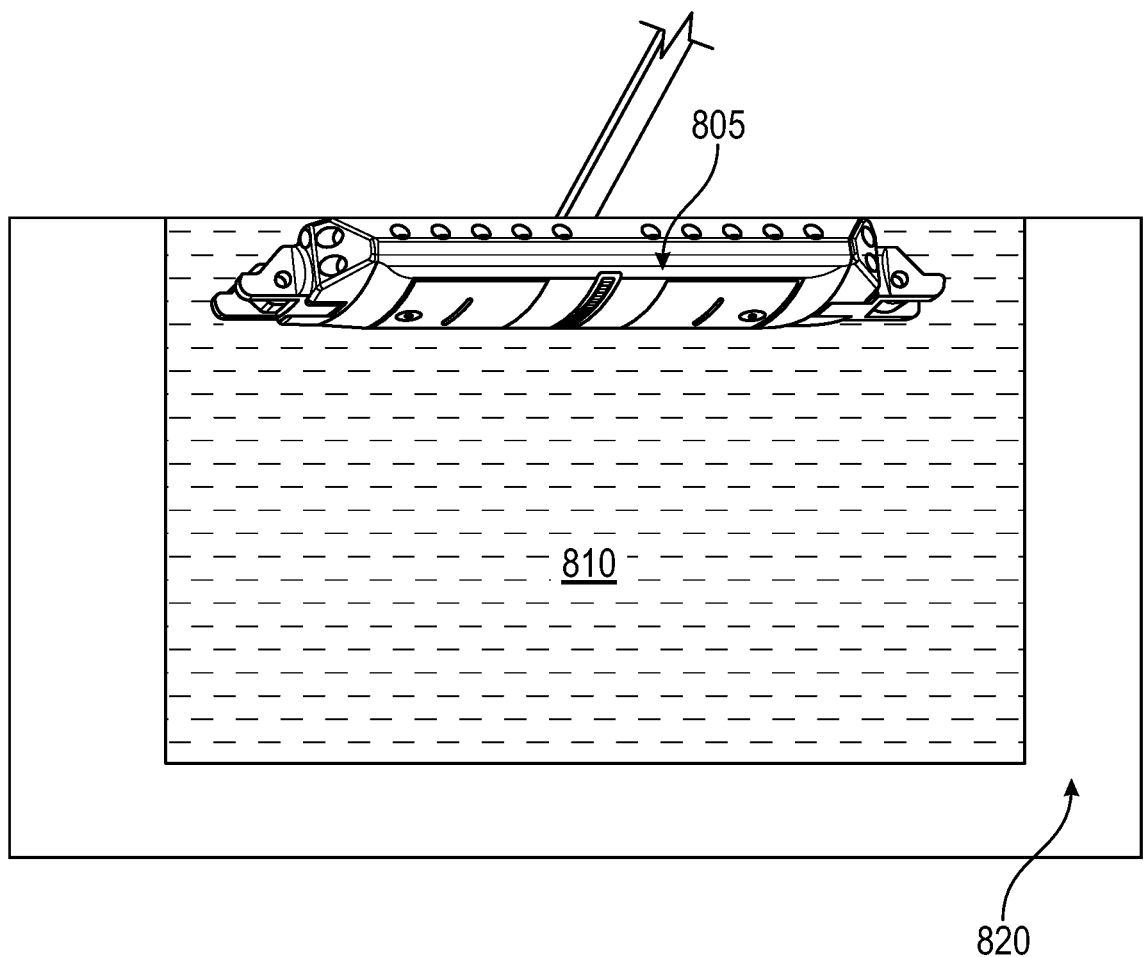
FIG. 8 depicts an exemplary configuration for calibrating the borehole imager and dielectric tool using a calibrating fluid with known electrical properties.

FIG. 8 depicts an exemplary configuration for calibrating the borehole imager and dielectric tool using a calibrating fluid with known electrical properties. In one or more embodiments, the calibrator fluid 810 may be a homogeneous fluid with known electrical properties, such as a brine solution, but in one or more embodiments may be a heterogenous solution if one or more additional fluids are introduced. In one or more embodiments, a vector network analyzer (not shown) may be used to measure the electrical properties of the calibrator fluid. This calibrator fluid may fill, partially or completely, a container 820 and portions of one or more of a tool 805 may be submerged into the calibrator fluid 810. In one or more embodiments, the tool 805 may comprise one of the dielectric tool and of the borehole imager.

In one or more embodiments, alternative methods may be used to calibrate one or more of the borehole imager and the dielectric tool. For example, in one or more embodiments, an electrical circuit with discrete elements consisting of one or more resistors, capacitors, inductors, and other electrical circuit elements may be directly connected to the terminals of the tools for calibration instead of submerging portions of one or more of a tool 805 in the calibrator fluid 810. However, this approach may not properly account for spreading of currents in an actual formation. In one or more embodiments, calibration may be applied to measured voltages and currents (or impedances) rather than the permittivities and resistivities obtained using a quantitative solution. In this approach, it may also be possible to directly use the measurements of the dielectric tool and the borehole imager in a joint quantitative solution such as an iterative inversion. In one or more embodiments, calibrated permittivity and resistivity of the dielectric tool may only be used to regularize the quantitative solution of the borehole imager tool.

Reference measurements using the vector network analyzer of tool 805 after submersion in the calibrator fluid 810 may enable measurements of the dielectric tool and borehole imager to be calibrated to. Both the dielectric tool and the borehole imager tools are shallow tools with a low depth of investigation, on the scale of inches or millimeters. As a result, the contribution of the media outside the container 820 to measurements may be ignored for practical purposes. A set of calibration coefficients may be obtained using this procedure for the dielectric tool and each of the operating frequencies of the borehole imager. Once actual logging measurements are made, measurements of the borehole imager may be used in a quantitative solution to determine uncalibrated formation permittivity and formation resistivity results. See FIG. 9. Calculated permittivities and conductivities of the borehole imager and the dielectric tool may be aligned and calibrated using the stored calibration coefficients. Finally, the calibration measurements may be used together to solve for the dispersion curves of formation permittivity and formation resistivity and may be used with the petrophysical inversion 520 of FIG. 5. In one or more embodiments, the dispersion curve may only be available at a fixed azimuthal position. However, the petrophysical parameters obtained using this combined processing may be used to constrain the results for additional azimuthal points where only borehole imager measurements may be available.

Figure 9:
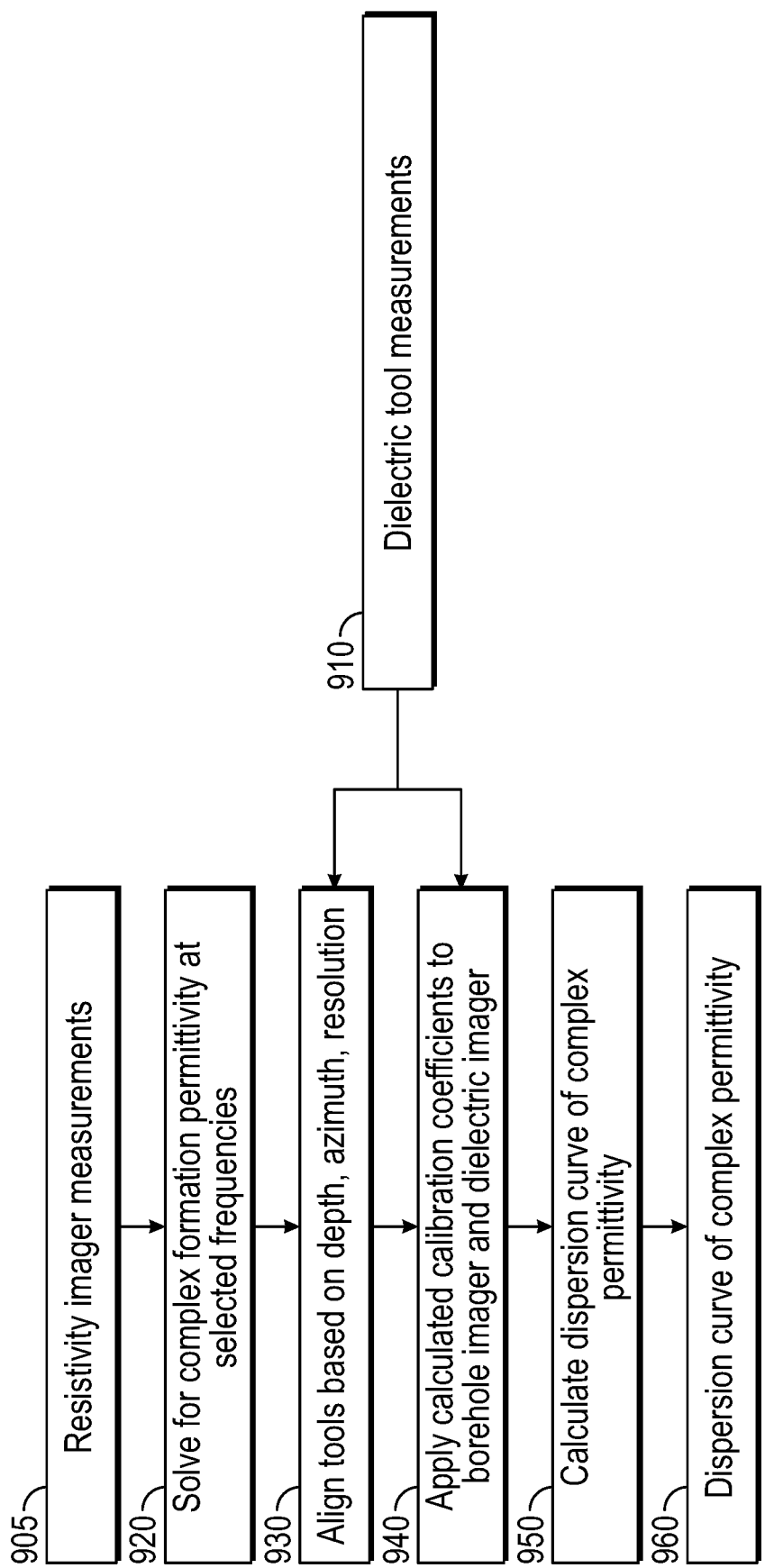
FIG. 9 depicts an exemplary flow diagram illustrating a method for obtaining a dispersion curve describing a subsurface formation based on measurements from a borehole imager and a dielectric tool.

FIG. 9 depicts an exemplary flow diagram illustrating a method for obtaining a dispersion curve describing a subsurface formation based on measurements from a borehole imager and a dielectric tool. Steps 920, 930, 950 are performed identically to the corresponding steps 420, 430, and 450 of FIG. 4. In contrast to step 440, the calculated calibration coefficients are applied to the borehole imager and dielectric tool measurements in step 940.

Figure 10:
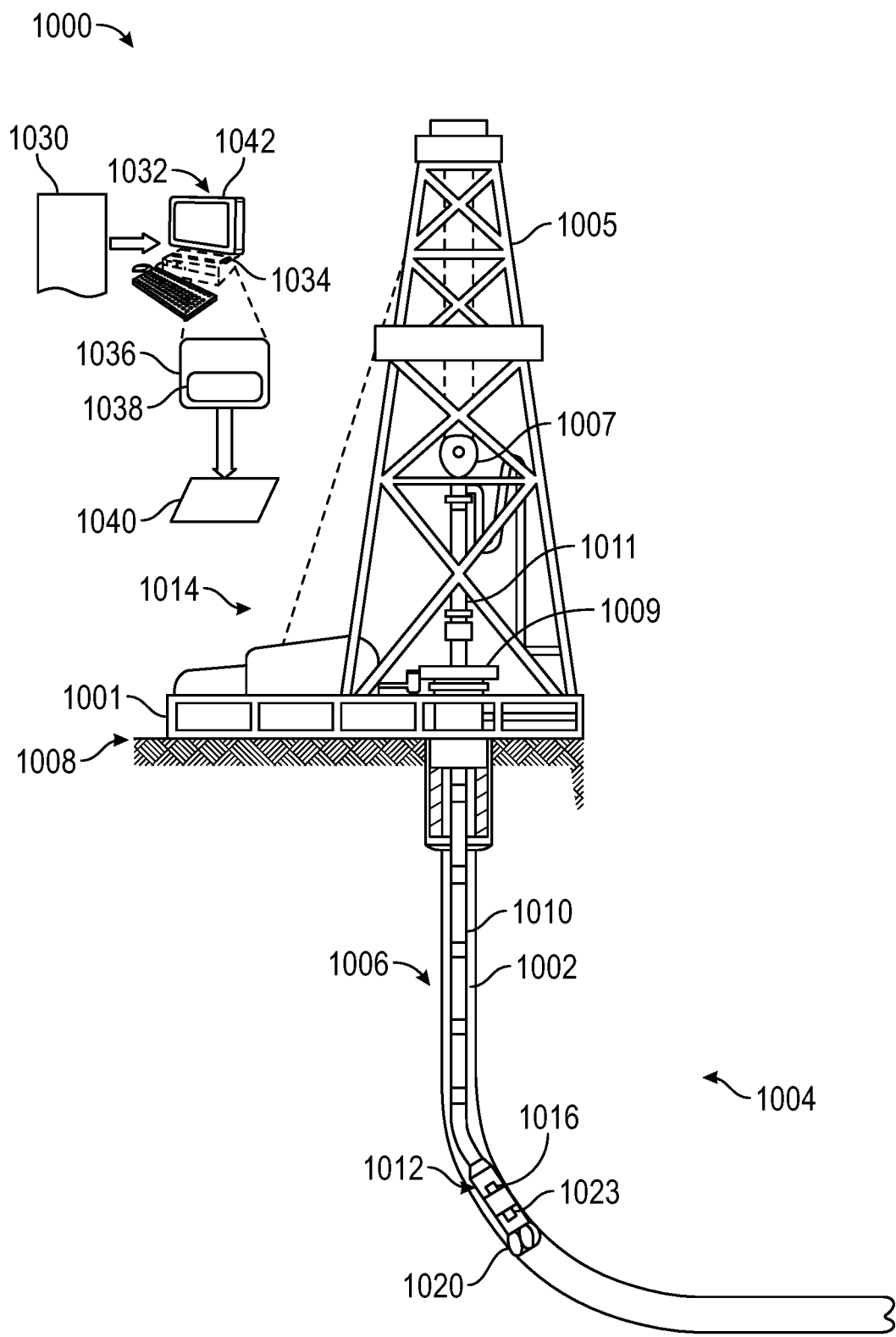
FIG. 10 depicts a partial cross-section view of an exemplary environment in which some of the operations and functions described herein may be performed.

FIG. 10 depicts a partial cross-section view of an exemplary environment 1000 in which some of the operations and functions described herein may be performed. As illustrated, a borehole 1002 may extend through the subsurface formation 1004. Conveyance component 1014, which in one or more embodiments may be a hoist, may be used to run a logging tool 1020 into borehole 1002. Conveyance component 1014 may be disposed on a recovery vehicle (not shown). Conveyance component 1014 may be used, for example, to raise and lower the downhole tool 1012 in borehole 1002. In one or more embodiments, downhole tool 1012 may be disposed from a hoist 1004 installed at the surface 1008. In one or more embodiments, downhole tool 1012 may be disposed from a hoist 1004 located on recovery vehicle (not shown). In one or more embodiments, downhole tool 1012 may be suspended in borehole 104 using one or more of wireline, coiled tubing, wired drill pipe, slickline, and downhole tractor. Downhole tool 1012 may comprise a tool mandrel. The tool body may be any suitable material, including without limitation titanium, stainless steel, alloys, plastic, combinations thereof, and the like. Downhole tool 1012 may further comprise drill bit 1020.

The apparatus further includes a drilling platform 1001 that supports a derrick 1005 having a traveling block 1007 for raising and lowering tool string 1010. Tool string 1010 may include, but is not limited to, drill pipe and coiled tubing, as generally known to those skilled in the art. A kelly 1011 may support tool string 1010 as it may be lowered through a rotary table 1114. A drill bit 1020 may be attached to the distal end of tool string 1010 and may be driven either by a downhole motor and/or via rotation of tool string 1010 from the surface 1008. Without limitation, drill bit 1020 may include, roller cone bits, PDC bits, natural diamond bits, any hole openers, reamers, coring bits, and the like. As drill bit 1020 rotates, it may create and extend borehole 1002 that penetrates various subterranean formations such as 1004. A pump (not shown) may circulate drilling fluid through a feed pipe to kelly 1011, downhole through interior of tool string 1010, through orifices in drill bit 1020, back to surface 1008 via annulus 1022 surrounding tool string 1010.

In one or more embodiments, downhole tool 1012 may comprise one or more tools, including without limitation a borehole imager and a dielectric tool, wherein the one or more tools which may further comprise one or more transmitters 1016 and one or more receivers 1023.

Figure 12:
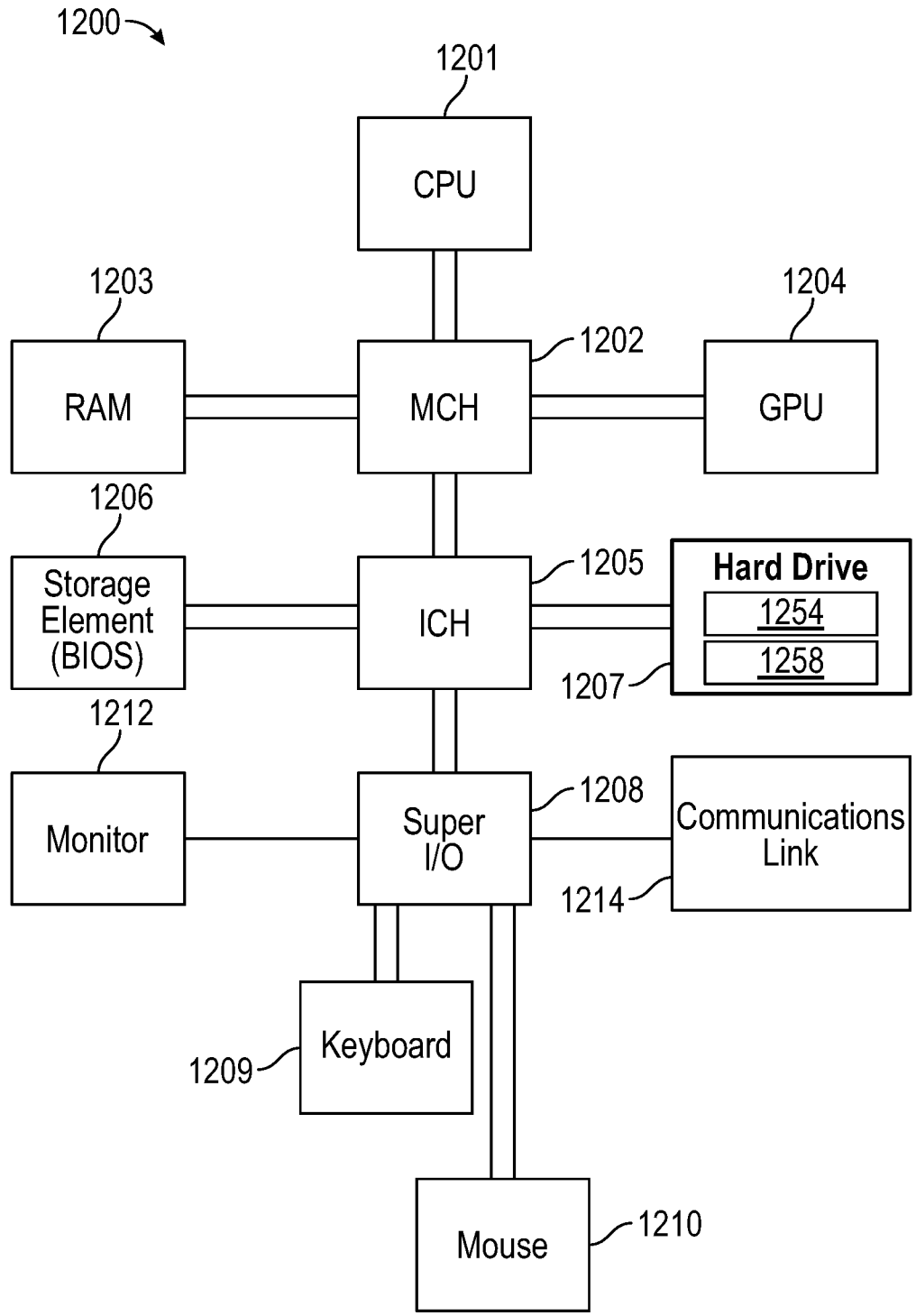
FIG. 12 depicts a schematic diagram of an information handling system for use with or in a wellbore environment, according to one or more aspects of the present disclosure.

In one or more embodiments, downhole tool 1012 may be communicatively coupled to an information handling system 1032 at the surface 1008. Information handling system 1032 may be similar to or the same as the information handling system 1200 of FIG. 12. Data 1030 from the one or more receivers 1023 or the receiver array (not shown) may be communicated to the information handling system 1032 via a wireline, a telemetry system, any other communication system, and any combination thereof. The data 1030 may be stored in a memory 1203 as discussed with respect to FIG. 12. The information handling system 1032 may comprise a software application or program 1034 stored in a non-transitory memory (for example, as illustrated in FIG. 12) that comprises one or more instructions executable by a processor for processing or analyzing the data 1030. The software application or program 1034 may comprise or be communicatively coupled to one or more modules, software applications or programs, data and any other software or systems collectively referred to as computer elements 1036. Computer elements 1036 may comprise processed data 1038 from which one or more outputs 1040 are generated. The one or more outputs 1040 may be displayed on the monitor 1042 of the information handling system 1032. While FIG. 10 illustrates an information handling system 1032 located at a surface 1008, the present invention contemplates that the downhole tool 1012 may comprise a computing device that executes one or more instructions of a software application or program similarly or the same as the software application or program 1034.

FIG. 11 depicts a partial cross-section view of an exemplary apparatus 1100, including a downhole tool 1112 as part of a logging operation in a wellbore environment 1103, including a downhole tool 1112, according to one or more embodiments. As depicted in FIG. 11, wellbore environment 1103 comprises a borehole 1102 extending through various earth strata in a subsurface formation 1104. The downhole tool 1112 may be disposed or positioned within the borehole 1102. For example, the downhole tool 1112 may be coupled to a conveyance component 1114 for conveying the downhole tool 1112 into the borehole 1102. Conveyance component 1114 may comprise a wireline 1146. An annular casing 1106 extends from the surface 1108 into subsurface formation 1104. Casing 1106 provides a path through which one or more fluids travel from one or more downhole locations to the surface 1108. Casing 1106 may comprise one or more layers. In one or more embodiments, a log may be used to record measured data.

In one or more embodiments, downhole tool 1112 may comprise one or more tools, for example and without limitation, one or more of the dielectric tools and/or one or more of the borehole imagers disclosed herein, wherein the one or more tools comprise one or more receivers 1123 and one or more transmitters 1116. For example and without limitation, the one or more receivers 1123 may correspond to return electrode 140 and the one or more transmitters 1116 may correspond to button array 120. See FIG. 1. The one or more transmitters 1116 may be utilized to scan the borehole 1102 and formation 1104. In one or more embodiments, the one or more transmitters 1116 may be physically rotated. In one or more embodiments, the downhole tool 1112 may be moved along the length of the borehole 1102 to enable the one or more transmitters 116 to transmit signals in a plurality of positions.

In one or more embodiments, the downhole tool 1112 comprises a memory 1125 communicatively coupled to the one or more receivers 1123 or the receiver array 1124. Data associated with one or more electrical responses may be stored or recorded in the memory 1125. In one or more embodiments, the downhole tool 1112 may comprise an information handling system, for example, information handling system 1200 of FIG. 12. The memory 1125 may be communicatively coupled to or within an information handling system 1132 at the surface 1108. In one or more embodiments, memory 1125 may be communicatively coupled to or within an information handling system disposed or positioned within the downhole tool 1112 or any other downhole tool communicatively coupled to the downhole tool 1112.

Figure 11A:
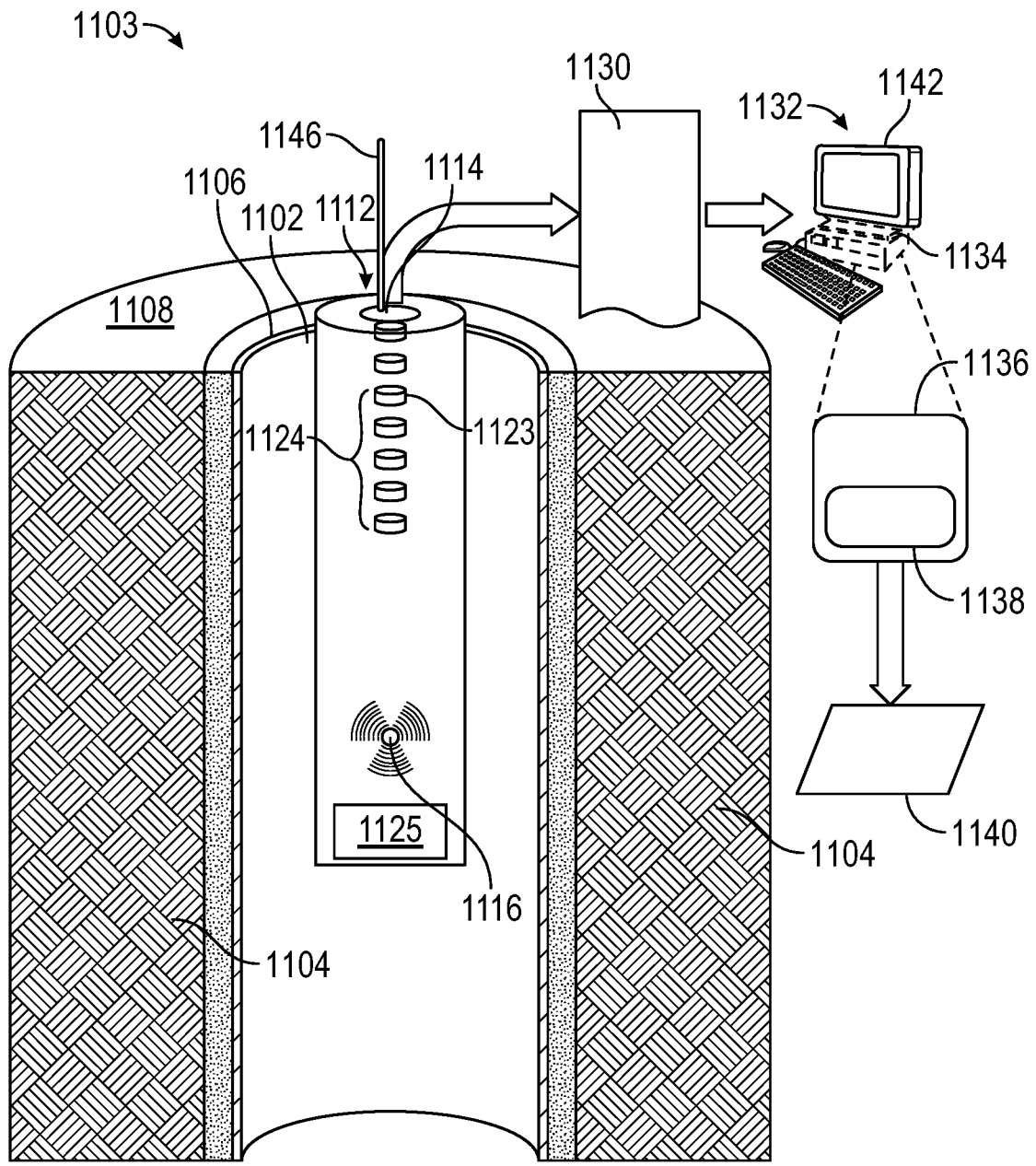
FIG. 11A depicts a partial cross-section view of an example downhole tool as part of a logging operation, according to one or more aspects of the present disclosure.
Figure 11B:
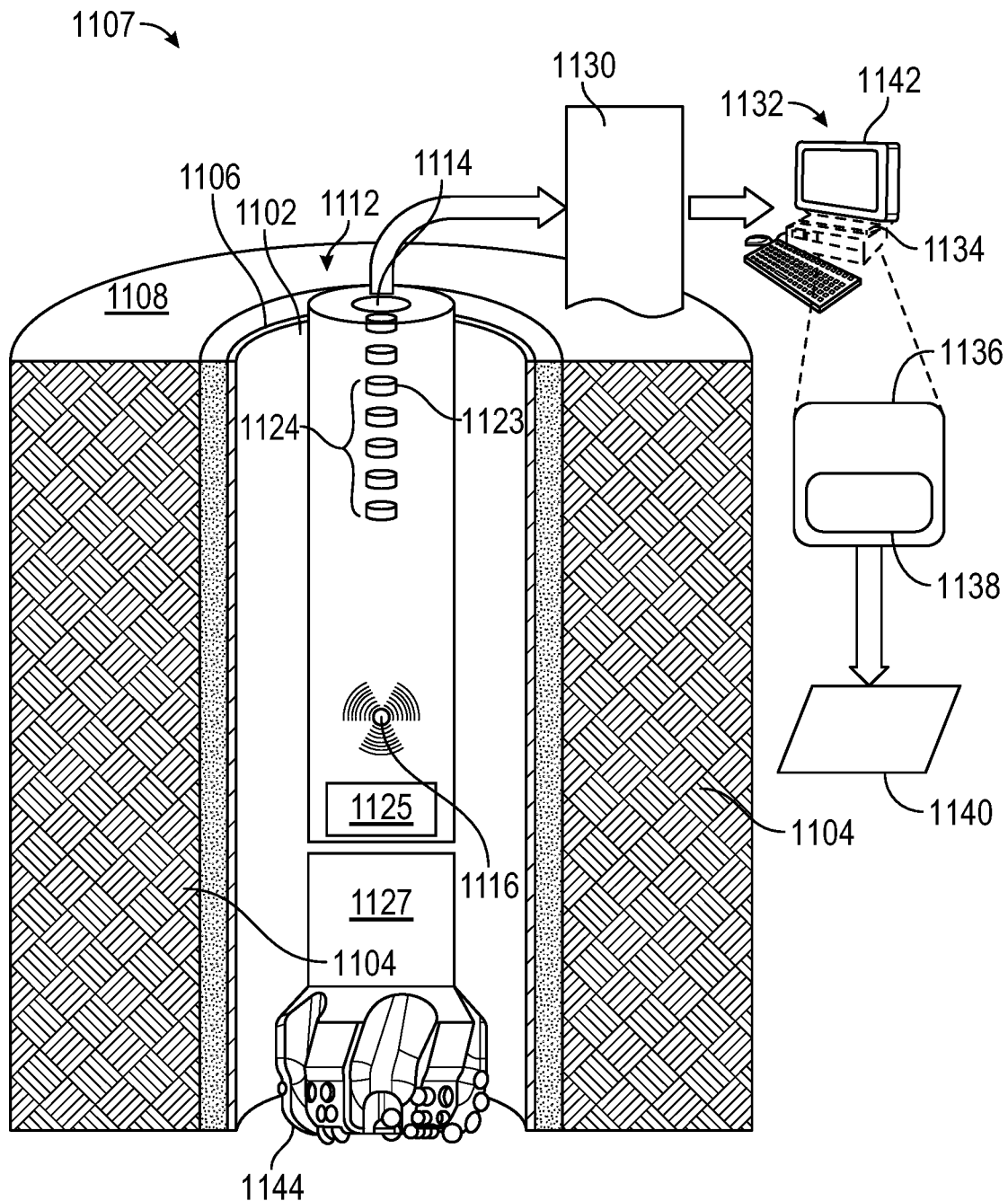
FIG. 11B depicts a partial cross-section view of an example downhole tool as part of a drilling operation, according to one or more aspects of the present disclosure.

In one or more embodiments, the downhole tool 1112 may be a logging-while-drilling tool (LWD) or measurement-while-drilling (MWD) as illustrated in FIG. 11B, a wireline tool as illustrated in FIG. 11A, or any other downhole tool capable of housing one or more receivers 1123 or receiver array 1124.

In one or more embodiments, the one or more receivers 1123 or the receiver array 1124 may be communicatively coupled in lieu of or in addition to the memory 1125 to an information handling system 1132 at the surface 1108. Information handling system 1132 may be similar to or the same as the information handling system 1200 of FIG. 12. Data 1130 from the one or more receivers 1123 or the receiver array 1124 may be communicated to the information handling system 1132 via a wireline, a telemetry system, any other communication system, and any combination thereof. The data 1130 may be stored in a memory 1203 as discussed with respect to FIG. 12. The information handling system 1132 may comprise a software application or program 1134 stored in a non-transitory memory (for example, as illustrated in FIG. 12) that comprises one or more instructions executable by a processor for processing or analyzing the data 1130. The software application or program 1134 may comprise or be communicatively coupled to one or more modules, software applications or programs, data and any other software or systems collectively referred to as computer elements 1136. Computer elements 1136 may comprise processed data 1138 from which one or more outputs 1140 are generated. The one or more outputs 1140 may be displayed on the monitor 1142 of the information handling system 1132. While FIG. 11A illustrates an information handling system 1132 located at a surface 1108, the present invention contemplates that the downhole tool 1112 may comprise a computing device that executes one or more instructions of a software application or program similarly or the same as the software application or program 1134.

The software application or program 1134 may comprise a transmitter control program and a receiver control program. The transmitter control program may control as well as capture and record data associated with the one or more transmitters 1116. The receiver control program may control as well as capture and record data associated with the one or more receivers one or more receivers 1123, wherein the captured and recorded data may indicate imaging properties in the formation 1104 which can be used to determine a drilling direction for extraction of one or more fluids from the formation 1104, as well as conditions in and around the borehole 1102 such as water-filled porosity and water salinity, which may in turn be used to determine water saturation, water resistivity and the cementation exponent m.

FIG. 11B depicts a wellbore environment 1107 including a downhole tool 1112 for a drilling operation, according to one or more embodiments. FIG. 11B is similar to FIG. 11A except that the downhole tool 1112 of FIG. 11B comprises or is coupled to a bottom hole assembly (BHA) 1125. BHA 1125 is coupled to a drill bit 1144. Conveyance component 1114 may comprise a tool string. In one or more embodiments, the downhole tool 1112 may be coupled to the tool string or imbedded as a component of the tool string. The BHA 1127 operates the drill bit 1144 through a drill bit motor or by rotating the entire string to drill into the subsurface formation 1104. In one or more embodiments, drilling mud is forced through the interior of the tool string, and through the interior of the BHA 1127. The drilling mud exits from the nozzles in the drill bit 1144 and cools and lubricates the bit 1144 and removes cuttings and carries the cuttings to the surface 108 along the annulus of the borehole 1102. The drilling mud may also serve as a communication medium of the telemetry to the surface 1108, for example, to information handling system 1132. By altering the flow of the drilling mud through the interior of the tool string, pressure pulses may be generated in the form of acoustic signals, in the column of drilling fluid. Moreover, by selectively varying control parameters of the downhole tool 1112, signals can be generated to carry information indicative of downhole parameters, characteristics, or conditions to the surface 1108 for analysis.

While FIGS. 10 and 11A-B generally depict a land-based system, it should be noted that like systems may operate in subsea locations as well. Additionally, while borehole 1102 is shown extending generally vertically into the geological formation 1004/1104, the principles described herein are also applicable to boreholes that extend at an angle through the geological formation 1004/1104, such as horizontal and slanted boreholes, as shown in FIG. 10, and vertical or low inclination angle wells and equipment as well as high inclination angle or horizontal placement of wells and equipment are also possible.

FIG. 12 depicts a schematic diagram of example information handling system 1200, for example, for use with or in an associated wellbore environment, for example without limitation the wellbore environment 1000/1100 illustrated in FIGS. 10 and 11A-B. The information handling system 1032/1132 of FIGS. 10 and 11A-B may take a form similar to the information handling system 1200. A processor or central processing unit (CPU) 1201 of the information handling system 1200 is communicatively coupled to a memory controller hub (MCH) or north bridge 1202. The processor 1201 may include, for example a microprocessor, microcontroller, digital signal processor (DSP), application specific integrated circuit (ASIC), or any other digital or analog circuitry configured to interpret and/or execute program instructions and/or process data. Processor 1201 may be configured to interpret and/or execute program instructions or other data retrieved and stored in any memory such as memory 1203 or hard drive 1207. Program instructions or other data may constitute portions of a software or application, for example, application 1258 or data 1254, for carrying out one or more methods described herein. Memory 1203 may include read-only memory (ROM), random access memory (RAM), solid state memory, or disk-based memory. Each memory module may include any system, device, or apparatus configured to retain program instructions and/or data for a period of time (for example, non-transitory computer-readable media). For example, instructions from a software program or application 1258 or data 1254 may be retrieved and stored in memory 1203 for execution or use by processor 1201. In one or more embodiments, the memory 1203 or the hard drive 1207 may include or comprise one or more non-transitory executable instructions that, when executed by the processor 1201, cause the processor 1201 to perform or initiate one or more operations or steps. The information handling system 1200 may be preprogrammed or it may be programmed (and reprogrammed) by loading a program from another source (for example, from a CD-ROM, from another computer device through a data network, or in another manner).

The data 1254 may include treatment data, geological data, fracture data, microseismic data, mud candidate data, borehole imager measured data, inversion-estimated imaging properties, or any other appropriate data. The one or more applications 1258 may include one or more machine learning models, applications for one or more of downsampling measured data, calculating misfits or to minimize cost functions, to perform petrochemical inversions, to solve for formation permittivity, to align measured data based on depth, azimuth, resolution, or any other measurement, extrapolating permittivity, scaling coefficients to match borehole imager measurements with dielectric tool measurements, calculate dispersion curves of permittivity, calibrating coefficients, or any other appropriate applications. In one or more embodiments, a memory of a computing device includes additional or different data, application, models, or other information. In one or more embodiments, the data 1254 may include treatment data relating to fracture treatment plans. For example, the treatment data may indicate a pumping schedule, parameters of a previous injection treatment, parameters of a future injection treatment, or one or more parameters of a proposed injection treatment. Such one or more parameters may include information on flow rates, flow volumes, slurry concentrations, fluid compositions, injection locations, injection times, or other parameters. The treatment data may include one or more treatment parameters that have been optimized or selected based on numerical simulations of fracture propagation. In one or more embodiments, the data 1254 may include one or more signals received by one or more receivers 1023/1123 or receiver array 1124 of FIGS. 10 and 11A-B, for example, data 1254 may comprise processed data 1038/1138 or data 1030/1130 as discussed above with respect to FIGS. 10 and 11A-B.

The one or more applications 1258 may comprise one or more software programs or applications, one or more scripts, one or more functions, one or more executables, or one or more other modules that are interpreted or executed by the processor 1201. For example, the one or more applications 1258 may include a fracture design module, a reservoir simulation tool, a hydraulic fracture simulation model, or any other appropriate function block. The one or more applications 1258 may include machine-readable instructions for performing one or more of the operations related to any one or more embodiments of the present disclosure. The one or more applications 1258 may include machine-readable instructions for generating a user interface or a plot, for example, illustrating fracture geometry (for example, length, width, spacing, orientation, etc.), pressure plot, hydrocarbon production performance. The one or more applications 1258 may obtain input data, such as treatment data, geological data, fracture data, measurement data, or other types of input data, from the memory 1203, from another local source, or from one or more remote sources (for example, via the one or more communication links 1214). The one or more applications 1258 may generate output data and store the output data in the memory 1203, hard drive 1207, in another local medium, or in one or more remote devices (for example, by sending the output data via the communication link 1214).

Modifications, additions, or omissions may be made to FIG. 12 without departing from the scope of the present disclosure. For example, FIG. 12 shows a particular configuration of components of information handling system 1200. However, any suitable configurations of components may be used. For example, components of information handling system 1200 may be implemented either as physical or logical components. Furthermore, in some embodiments, functionality associated with components of information handling system 1200 may be implemented in special purpose circuits or components. In other embodiments, functionality associated with components of information handling system 1200 may be implemented in configurable general-purpose circuit or components. For example, components of information handling system 1200 may be implemented by configured computer program instructions.

Memory controller hub 1202 may include a memory controller for directing information to or from various system memory components within the information handling system 1200, such as memory 1203, storage element 1206, and hard drive 1207. The memory controller hub 1202 may be coupled to memory 1203 and a graphics processing unit (GPU) 1204. Memory controller hub 1202 may also be coupled to an I/O controller hub (ICH) or south bridge 1205. I/O controller hub 1205 is coupled to storage elements of the information handling system 1200, including a storage element 1206, which may comprise a flash ROM that includes a basic input/output system (BIOS) of the computer system. I/O controller hub 1205 is also coupled to the hard drive 1207 of the information handling system 1200. I/O controller hub 1205 may also be coupled to an I/O chip or interface, for example, a Super I/O chip 1208, which is itself coupled to several of the I/O ports of the computer system, including a keyboard 1209, a mouse 1210, a monitor 1212 and one or more communications link 1214. Any one or more input/output devices receive and transmit data in analog or digital form over one or more communication links 1214 such as a serial link, a wireless link (for example, infrared, radio frequency, or others), a parallel link, or another type of link. The one or more communication links 1214 may comprise any type of communication channel, connector, data communication network, or other link. For example, the one or more communication links 1214 may comprise a wireless or a wired network, a Local Area Network (LAN), a Wide Area Network (WAN), a private network, a public network (such as the Internet), a WiFi network, a network that includes a satellite link, or another type of data communication network.

A memory or storage device primarily stores one or more software applications or programs, which may also be described as program modules containing computer-executable instructions, which may be executed by the computing unit for implementing one or more embodiments of the present disclosure. The memory, therefore, may include one or more applications including, for example, a transmitter control application, a receiver control application, and one or more applications enabling one or more of the processes or sub-processes illustrated in FIGS. 2, 4, 5, 8, and 9 and may produce outputs like those shown in FIGS. 6 and 7. These applications may integrate functionality from additional or third-party application programs or from system files stored in memory or on a storage device. An application may perform one or more of the steps in FIGS. 2, 4, 5, 8, and 9. System files, such as an ASCII text file may be used to store the instructions, data input, or both for the applications as may be required in, for example, one or more steps of FIGS. 2, 4, 5, 8, and 9. In certain embodiments, any one or more other applications may be used in combination. In certain embodiments, any one or more other applications may be used in combination may be used as stand-alone applications.

Although the computing device 1200 is shown as having one or more generalized memories, the computing device 1200 typically includes a variety of non-transitory computer readable media. By way of example, and not limitation, non-transitory computer readable media may comprise computer storage media and communication media. The memory may include computer storage media, such as a ROM and RAM in the form of volatile memory, nonvolatile memory, or both. A BIOS containing the basic routines that help to transfer information between elements within the computing unit, such as during start-up, is typically stored in the ROM. RAM typically contains data, program modules, other executable instructions, or any combination thereof that are immediately accessible to, presently being operated on, or both by the processing unit. By way of example, and not limitation, the computing device 1200 may include an operating system, application programs, other program modules, and program data.

The components shown in the memory may also be included in other removable/non-removable, volatile/nonvolatile non-transitory computer storage media or the components may be implemented in the computing device 1200 through an application program interface ("API") or cloud computing, which may reside on a separate computing device coupled through a computer system or network (not shown). For example and without limitation, a hard disk drive may read from or write to non-removable, nonvolatile magnetic media, a magnetic disk drive may read from or write to a removable, nonvolatile magnetic disk, and an optical disk drive may read from or write to a removable, nonvolatile optical disk such as a CD-ROM or other optical media. Other removable/non-removable, volatile/nonvolatile computer storage media that may be used in the exemplary operating environment may include, but are not limited to, magnetic tape cassettes, flash memory cards, digital versatile disks, digital video tape, solid state RAM, solid state ROM, or the like. The drives and their associated computer storage media discussed above provide storage of computer readable instructions, data structures, program modules, and other data for the computing unit.

The computing device 1200 may receive commands or information from a user through one or more input devices such as the keyboard 1209 and the mouse 1210. Additional input devices may comprise a microphone, joystick, touchscreen, scanner, voice or gesture recognition, one or more sensors including one or more seismic sensors, and the like (not shown). These and other input devices may be coupled to the processing unit through the Super I/O chip 1208 that is coupled to the ICH 1205, but may be coupled by other interface and bus structures, such as a parallel port or a universal serial bus (USB) (not shown).

A monitor or other type of display device (not shown) may be coupled to the MCH 1202 via an interface, such as the GPU 1204 or via Super I/O chip 1208. A graphical user interface ("GUI") may also be used with the video interface 1204 to receive instructions from a user and transmit instructions to the central processing unit 1201. A GUI may be used to display the outputs of the processes described in in FIGS. 2, 4, 5, 8, and 9, including without limitation FIGS. 6 and 7, and may be used to prompt or display modification of subsurface operations or production activities. The computing device 1200 may comprise peripheral output devices such as speakers, printer, external memory, any other device, or any combination thereof, which may be coupled through any output peripheral interface.

Any one or more input/output devices may receive and transmit data in analog or digital form over one or more communication links 1214 such as a serial link, a wireless link (for example, infrared, radio frequency, or others), a parallel link, or another type of link. The one or more communication links 1214 may comprise any type of communication channel, connector, data communication network, or other link. For example, the one or more communication links 1214 may comprise a wireless or a wired network, a Local Area Network (LAN), a Wide Area Network (WAN), a private network, a public network (such as the Internet), a wireless fidelity or WiFi network, a network that includes a satellite link, or another type of data communication network.

Although many other internal components of the computing device 1200 are not shown, those of ordinary skill in the art will appreciate that such components and their interconnection are well known.

Any one or more embodiments of the present disclosure may be implemented through a computer-executable program of instructions, such as program modules, generally referred to as software applications or application programs executed by a computer. A software application may include, for example, routines, programs, objects, components, data structures, any other executable instructions, or any combination thereof, that perform particular tasks or implement particular abstract data types. The software application forms an interface to allow a computer to react according to a source of input. For example, an interface application may be used to implement any one or more embodiments of the present disclosure. The software application may also cooperate with other applications or code segments to initiate a variety of tasks based, at least in part, on data received, a source of data, or any combination thereof. Other applications or code segments may provide optimization components including, but not limited to, neural networks, earth modeling, history-matching, optimization, visualization, data management, and economics. The software application may be stored, carried, or both on any variety of memory such as CD-ROM, magnetic disk, optical disk, bubble memory, and semiconductor memory (for example, various types of RAM or ROM). Furthermore, the software application and one or more inputs or outputs may be transmitted over a variety of carrier media including, but not limited to, wireless, wired, optical fiber, metallic wire, telemetry, any one or more networks (such as the Internet), or any combination thereof.

Moreover, those skilled in the art will appreciate that one or more of the embodiments may comprise a variety of computer-system configurations, including hand-held devices, multiprocessor systems, microprocessor-based or programmable consumer electronics, minicomputers, mainframe computers, and any combination thereof. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may, therefore, be implemented in connection with various hardware, software, or any combination thereof, in a computer system, information handling system, or other processing system.

In one or more embodiments, a method for obtaining calibrated permittivity dispersion measurements of a subsurface formation is disclosed where the method may include measuring impedance of the subsurface formation using a borehole imager at a first one or more frequencies; measuring permittivity of the subsurface formation using a reference tool at a second one or more frequencies; calculating a first dispersion curve of the permittivity of the subsurface formation based at least in part on the measured impedance of the subsurface formation at the first one or more frequencies; extrapolating the permittivity of the subsurface formation to the second one or more frequencies using the calculated first dispersion curve of the permittivity of the subsurface formation; calibrating the permittivity of the subsurface formation based at least in part on the extrapolated permittivity of the subsurface formation and the measured permittivity of the subsurface formation; and generating a second dispersion curve of the permittivity of the subsurface formation based at least in part on one or more of the calibrated permittivity of the subsurface formation at the first one or more frequencies and the measured permittivity of the subsurface formation at the second one or more frequencies.

In one or more embodiments, the reference tool in the method may be a dielectric tool. In one or more embodiments, the reference tool in the method may be vector network analyzer. In one or more embodiments, the method may further include measuring an impedance of the subsurface formation using the borehole imager at a third one or more frequencies, and calculating the first dispersion curve of the permittivity of the subsurface formation may also include calculating a real component of the permittivity of the subsurface formation using the measured impedance of the subsurface formation at the first one or more frequencies and calculating an imaginary component of the permittivity of the subsurface formation using the measured impedance of the subsurface formation at the third one or more frequencies. In one or more embodiments, extrapolating the permittivity of the subsurface formation to the second one or more frequencies may also include extrapolating a real component of the permittivity of the subsurface formation to the second one or more frequencies and extrapolating an imaginary component of the permittivity of the subsurface formation to the second one or more frequencies. In one or more embodiments, extrapolating the permittivity of the subsurface formation to the second one or more frequencies may also include extrapolating a real component of the permittivity of the subsurface formation to the second one or more frequencies and extrapolating an imaginary component of the permittivity of the subsurface formation to the second one or more frequencies. In one or more embodiments, the method may also include comprising measuring the impedance of a wellbore within the subsurface formation using the borehole imager at the first one or more frequencies during a first measuring run and measuring the permittivity of the wellbore within the subsurface formation using the dielectric tool during a second measuring run. In one or more embodiments, the first measuring run and the second measuring run occur simultaneously. In one or more embodiments, the method may also include aligning one or more depths of the measured impedance of a wellbore within the subsurface formation with one or more depths of the measured permittivity of the wellbore within the subsurface formation. In one or more embodiments, calculating the first dispersion curve of the permittivity of the subsurface formation may also include using an inversion of the measured impedance of the subsurface formation at the first one or more frequencies. In one or more embodiments, the method may also include using a mixing law and one or more of the first dispersion curve of the permittivity of the subsurface formation and the second dispersion curve of the permittivity of the subsurface formation to calculate one or more of a texture exponent of the subsurface formation and a water-filled porosity of the subsurface formation.

In one or more embodiments, a method for obtaining calibrated permittivity dispersion measurements of a subsurface formation is disclosed, where the method may include determining calibration coefficients for a borehole imager using a first calibrator; measuring impedance of the subsurface formation using a borehole imager at a first one or more frequencies; calibrating the impedance of the subsurface formation based at least in part on the calibration coefficients for the borehole imager; calculating a first dispersion curve of a permittivity of the subsurface formation based at least in part on the calibrated impedance of the subsurface formation at the first one or more frequencies; determining calibration coefficients for a reference tool using a second calibrator; measuring permittivity of the subsurface formation using the reference tool at a second one or more frequencies; calibrating the permittivity of the subsurface formation based at least in part on the calibration coefficients for the reference tool; and calculating a second dispersion curve of the permittivity of the subsurface formation based at least in part on one or more of the calibrated dispersion of the permittivity of the subsurface formation at the first one or more frequencies and the calibrated permittivity of the subsurface formation at the second one or more frequencies.

In one or more embodiments, the method may also include measuring impedance of the subsurface formation using the borehole imager at a third one or more frequencies, and wherein calculating the first dispersion curve of the permittivity of the subsurface formation further comprises calculating a real component of the permittivity of the subsurface formation using the measured impedance of the subsurface formation at the first one or more frequencies and calculating an imaginary component of the permittivity of the subsurface formation using the measured impedance of the subsurface formation at the third one or more frequencies. In one or more embodiments, the method may also include measuring the impedance of a wellbore within the subsurface formation using the borehole imager at the first one or more frequencies during a first measuring run and measuring the permittivity of the wellbore within the subsurface formation using the dielectric tool during a second measuring run. In one or more embodiments, the method may also include aligning one or more depths of the measured impedance of a wellbore within the subsurface formation with one or more depths of the measured permittivity of the wellbore within the subsurface formation. In one or more embodiments, the method may also include calculating the first dispersion curve of the permittivity of the subsurface formation based at least in part on the measured impedance of the subsurface formation at the first one or more frequencies further comprises using an inversion of the measured impedance of the subsurface formation at the first one or more frequencies. In one or more embodiments, the method may also include using a mixing law and one or more of the first dispersion curve of the permittivity of the subsurface formation and the second dispersion curve of the permittivity of the subsurface formation to calculate one or more of a texture exponent of the subsurface formation and a water-filled porosity of the sub surface formation.

In one or more embodiments, a system for obtaining calibrated permittivity dispersion measurements of a subsurface formation is disclosed, where the system may include a borehole imager; a reference tool; and an information handling system coupled to the borehole imager and the reference tool, where the information system may include a processor, and a non-transitory computer readable medium for storing one or more instructions, where the one or more instructions, when executed, may cause the processor to log impedance of the subsurface formation obtained from the borehole imager operating at a first one or more frequencies; log permittivity of the subsurface formation obtained from the reference tool operating at a second one or more frequencies; calculate a first dispersion curve of the permittivity of the subsurface formation based at least in part on the logged impedance of the subsurface formation at the first one or more frequencies; extrapolate the permittivity of the subsurface formation to the second one or more frequencies using the calculated first dispersion curve of the permittivity of the subsurface formation; calibrate permittivity of the subsurface formation based at least in part on the extrapolated permittivity of the subsurface formation at the first one or more frequencies and the logged permittivity of the subsurface formation at the second one or more frequencies; and generate a second dispersion curve of the permittivity of the subsurface formation based at least in part on one or more of the calibrated permittivity of the subsurface formation at the first one or more frequencies and the logged permittivity of the subsurface formation at the second one or more frequencies.

In one or more embodiments, the system may also include one or more instructions that, when executed, cause the processor to log impedance of the subsurface formation obtained from the borehole imager operating at a third one or more frequencies, calculate a real component of the permittivity of the subsurface formation using the measured impedance of the subsurface formation at the first one or more frequencies, and calculate an imaginary component of the permittivity of the subsurface formation using the measured impedance of the subsurface formation at the third one or more frequencies. In one or more embodiments, the system may also include one or more instructions that, when executed, cause the processor to extrapolate a real component of the permittivity of the subsurface formation to the second one or more frequencies and extrapolate an imaginary component of the permittivity of the subsurface formation to the second one or more frequencies. In one or more embodiments, the system may also include one or more instructions that, when executed, cause the processor to align one or more depths of the logged impedance of a wellbore within the subsurface formation with one or more depths of the logged permittivity of the wellbore within the subsurface formation.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof. In particular, with regards to the methods disclosed, one or more steps may not be required in all embodiments of the methods and the steps disclosed in the methods may be performed in a different order than was described. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. In particular, every range of values (for example, "from about a to about b," or, equivalently, "from approximately a to b," or, equivalently, "from approximately a-b") disclosed herein is to be understood as referring to the power set (the set of all subsets) of the respective range of values. The terms in the claims have their plain, ordinary meaning unless otherwise explicitly and clearly defined by the patentee.

What is claimed is:

1. A method for obtaining calibrated permittivity dispersion measurements of a subsurface formation, the method comprising:
    measuring impedance of the subsurface formation using a borehole imager at a first one or more frequencies during a first measurement;
    measuring permittivity of the subsurface formation using a dielectric tool at a second one or more frequencies during a second measurement, wherein the first and second measurements are at different depths of the subsurface formation or occur during different times;
    calculating a first dispersion curve of the permittivity of the subsurface formation based at least in part on the measured impedance of the subsurface formation at the first one or more frequencies;
    extrapolating the permittivity of the subsurface formation to the second one or more frequencies using the calculated first dispersion curve of the permittivity of the subsurface formation;
    calibrating the permittivity of the subsurface formation based at least in part on the extrapolated permittivity of the subsurface formation and the measured permittivity of the subsurface formation; and
    generating a second dispersion curve of the permittivity of the subsurface formation based at least in part on one or more of the calibrated permittivity of the subsurface formation at the first one or more frequencies and the measured permittivity of the subsurface formation at the second one or more frequencies.

2. The method of claim 1, wherein the reference tool is a vector network analyzer.

3. The method of claim 1, further comprising measuring impedance of the subsurface formation using the borehole imager at a third one or more frequencies, and wherein calculating the first dispersion curve of the permittivity of the subsurface formation further comprises calculating a real component of the permittivity of the subsurface formation using the measured impedance of the subsurface formation at the first one or more frequencies and calculating an imaginary component of the permittivity of the subsurface formation using the measured impedance of the subsurface formation at the third one or more frequencies.

4. The method of claim 3, wherein extrapolating the permittivity of the subsurface formation to the second one or more frequencies further comprises extrapolating a real component of the permittivity of the subsurface formation to the second one or more frequencies and extrapolating an imaginary component of the permittivity of the subsurface formation to the second one or more frequencies.

5. The method of claim 1, wherein the first measurement and the second measurement occur simultaneously.

6. The method of claim 1, further comprising aligning the depth of the first measurement of a wellbore within the subsurface formation with the depth of the second measurement of the wellbore within the subsurface formation.

7. The method of claim 1 wherein calculating the first dispersion curve of the permittivity of the subsurface formation further comprises using an inversion of the measured impedance of the subsurface formation at the first one or more frequencies.

8. The method of claim 1 further comprising using a mixing law and one or more of the first dispersion curve of the permittivity of the subsurface formation and the second dispersion curve of the permittivity of the subsurface formation to calculate one or more of a texture exponent of the subsurface formation and a water-filled porosity of the subsurface formation.

9. A system for obtaining calibrated permittivity dispersion measurements of a subsurface formation, the system comprising:
   a borehole imager;
   a reference tool; and
   an information handling system coupled to the borehole imager and the reference tool, the information system comprising:
   a processor, and
   a non-transitory computer readable medium for storing one or more instructions that, when executed, causes the processor to:
   log impedance of the subsurface formation obtained from the borehole imager operating at a first one or more frequencies during a first measurement;
   log permittivity of the subsurface formation obtained from the dielectric tool operating at a second one or more frequencies during a second measurement;
   calculate a first dispersion curve of the permittivity of the subsurface formation based at least in part on the logged impedance of the subsurface formation at the first one or more frequencies;
   extrapolate the permittivity of the subsurface formation to the second one or more frequencies using the calculated first dispersion curve of the permittivity of the subsurface formation;
   calibrate permittivity of the subsurface formation based at least in part on the extrapolated permittivity of the subsurface formation at the first one or more frequencies and the logged permittivity of the subsurface formation at the second one or more frequencies; and
   generate a second dispersion curve of the permittivity of the subsurface formation based at least in part on one or more of the calibrated permittivity of the subsurface formation at the first one or more frequencies and the logged permittivity of the subsurface formation at the second one or more frequencies.

10. The system of claim 9, wherein the one or more instructions that, when executed, further causes the processor to log impedance of the subsurface formation obtained from the borehole imager operating at a third one or more frequencies, calculate a real component of the permittivity of the subsurface formation using the measured impedance of the subsurface formation at the first one or more frequencies, and calculate an imaginary component of the permittivity of the subsurface formation using the measured impedance of the subsurface formation at the third one or more frequencies.

11. The composition of claim 9, wherein the one or more instructions that, when executed, further causes the processor to extrapolate a real component of the permittivity of the subsurface formation to the second one or more frequencies and extrapolate an imaginary component of the permittivity of the subsurface formation to the second one or more frequencies.

12. The composition of claim 9, wherein the one or more instructions that, when executed, further causes the processor to align one or more depths of the logged impedance of a wellbore within the subsurface formation with one or more depths of the logged permittivity of the wellbore within the subsurface formation.

* * * * *